US012622265B2

(12) United States Patent
Chang

(10) Patent No.: US 12,622,265 B2
(45) Date of Patent: May 5, 2026

(54) STACKED SEMICONDUCTOR DEVICE INCLUDING A COOLING STRUCTURE

(71) Applicant: Taiwan Semiconductor Manufacturing Company, Ltd., Hsinchu (TW)

(72) Inventor: Jen-Yuan Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/446,076

(22) Filed: Aug. 8, 2023

(65) Prior Publication Data

US 2023/0386957 A1     Nov. 30, 2023

Related U.S. Application Data

(62) Division of application No. 17/304,983, filed on Jun. 29, 2021, now Pat. No. 11,984,376.

(60) Provisional application No. 63/201,300, filed on Apr. 22, 2021.

(51) Int. Cl.
| | |
|---|---|
| *H01L 23/36* | (2006.01) |
| *H01L 21/50* | (2006.01) |
| *H01L 23/00* | (2006.01) |
| *H01L 23/538* | (2006.01) |
| *H01L 25/065* | (2023.01) |

(52) U.S. Cl.
CPC .............. *H01L 23/36* (2013.01); *H01L 21/50* (2013.01); *H01L 23/5384* (2013.01); *H01L 24/80* (2013.01); *H01L 25/0657* (2013.01)

(58) Field of Classification Search
None
See application file for complete search history.

(56) References Cited

U.S. PATENT DOCUMENTS

| | | | | |
|---|---|---|---|---|
| 7,301,233 B2 * | 11/2007 | Lee | .......................... | H01L 23/38 |
| | | | | 257/713 |
| 8,933,562 B2 * | 1/2015 | Kinser | .................... | H01L 23/38 |
| | | | | 257/738 |
| 9,177,981 B2 * | 11/2015 | Nishizawa | ........ | H01L 27/14683 |
| 9,257,361 B2 * | 2/2016 | Farooq | .................... | F25B 21/02 |
| 9,671,141 B2 * | 6/2017 | Kim | ........................ | F25B 21/02 |
| 9,711,379 B2 | 7/2017 | Yu et al. | | |
| 10,026,715 B2 | 7/2018 | Kume et al. | | |

(Continued)

FOREIGN PATENT DOCUMENTS

| | | |
|---|---|---|
| CN | 104465642 A | 3/2015 |
| CN | 110349862 A | 10/2019 |

(Continued)

*Primary Examiner* — Telly D Green
(74) *Attorney, Agent, or Firm* — Harrity & Harrity, LLP

(57)     ABSTRACT

A stacked semiconductor device includes a cooling structure to increase the cooling efficiency of the stacked semiconductor device. The cooling structure includes various types of cooling components integrated into the stacked semiconductor device that are configured to remove and/or dissipate heat from dies of the stacked semiconductor device. In this way, the cooling structure reduces device failures and permits the stacked semiconductor device to operate at greater voltages, greater speeds, and/or other increased performance parameters by removing and/or dissipating heat from the stacked semiconductor device.

20 Claims, 31 Drawing Sheets

(56) References Cited

U.S. PATENT DOCUMENTS

| | | | |
|---|---|---|---|
| 11,094,672 B2 | 8/2021 | Elsherbini et al. | |
| 11,139,249 B2 | 10/2021 | Yu et al. | |
| 2003/0113950 A1* | 6/2003 | Cooper | H10N 10/852 |
| | | | 438/54 |
| 2005/0150539 A1* | 7/2005 | Ghoshal | H10N 19/00 |
| | | | 136/201 |
| 2006/0001140 A1* | 1/2006 | Lee | H01L 23/38 |
| | | | 257/E25.013 |
| 2008/0246126 A1 | 10/2008 | Bowles et al. | |
| 2010/0038802 A1 | 2/2010 | Chen et al. | |
| 2010/0244208 A1* | 9/2010 | Pagaila | H01L 23/50 |
| | | | 257/659 |
| 2011/0042805 A1* | 2/2011 | Yu | H10N 10/17 |
| | | | 257/737 |
| 2011/0104846 A1* | 5/2011 | Hsu | H01L 23/481 |
| | | | 438/54 |
| 2011/0215457 A1 | 9/2011 | Park | |
| 2011/0290295 A1* | 12/2011 | Veerasamy | H10F 77/484 |
| | | | 136/224 |
| 2012/0217374 A1* | 8/2012 | Nishizawa | H01L 27/14618 |
| | | | 257/E23.141 |
| 2014/0035630 A1* | 2/2014 | O'Donnell | H01L 23/481 |
| | | | 257/528 |
| 2014/0203433 A1* | 7/2014 | Kinser | H01L 23/367 |
| | | | 257/738 |
| 2014/0264804 A1 | 9/2014 | Terrill et al. | |
| 2015/0059361 A1* | 3/2015 | Farooq | H01L 23/367 |
| | | | 438/653 |
| 2015/0318267 A1 | 11/2015 | Yu et al. | |
| 2017/0179000 A1* | 6/2017 | Jha | H10N 10/01 |
| 2017/0186728 A1 | 6/2017 | Chainer | |
| 2017/0207197 A1 | 7/2017 | Yu et al. | |
| 2019/0103390 A1 | 4/2019 | Chen et al. | |
| 2020/0105635 A1* | 4/2020 | Yu | H01L 23/3677 |
| 2020/0126888 A1* | 4/2020 | Lofgreen | H10N 10/01 |
| 2020/0185330 A1* | 6/2020 | Yu | H01L 24/24 |
| 2020/0273775 A1* | 8/2020 | Karhade | F28D 15/02 |
| 2021/0082784 A1* | 3/2021 | Cheng | H01L 23/481 |
| 2021/0098423 A1* | 4/2021 | Chen | H01L 24/08 |
| 2021/0125897 A1* | 4/2021 | Valavala | H10N 19/00 |
| 2021/0327866 A1* | 10/2021 | Yu | H01L 24/83 |
| 2021/0375830 A1 | 12/2021 | Elsherbini et al. | |
| 2022/0051985 A1 | 2/2022 | Agarwal et al. | |
| 2022/0199482 A1 | 6/2022 | Chiu et al. | |
| 2022/0344233 A1 | 10/2022 | Chang | |

FOREIGN PATENT DOCUMENTS

| | | |
|---|---|---|
| CN | 111900155 A | 11/2020 |
| CN | 112133680 A | 12/2020 |
| DE | 102020104147 A1 | 10/2020 |
| JP | 2018085452 A | 5/2018 |
| KR | 20150094939 A | 8/2015 |
| WO | 2014159471 A1 | 10/2014 |

* cited by examiner

200

400

316b

314b

204

320b

318b

302b

308b

306b

304b

520

524
526
522

510

514
516
512

530

532

534

800

810 Form a first die

820 Form a second die

830 Bond the first die and the second die to form a stacked semiconductor device 840 Form a cooling structure to dissipate heat that is generated by the first die and the second die

STACKED SEMICONDUCTOR DEVICE INCLUDING A COOLING STRUCTURE

CROSS-REFERENCE TO RELATED APPLICATIONS

This Patent Application is a divisional of U.S. patent application Ser. No. 17/304,983, filed Jun. 29, 2021, and entitled "STACKED SEMICONDUCTOR DEVICE INCLUDING A COOLING STRUCTURE," which claims priority to U.S. Patent Application No. 63/201,300, filed on Apr. 22, 2021, and entitled "STACKED SEMICONDUC-TOR DEVICE INCLUDING A HEAT DISSIPATION STRUCTURE." The disclosures of the prior Applications are considered part of and are incorporated by reference into this Patent Application.

BACKGROUND

Bonding in the semiconductor industry is a technique that may be used to form stacked semiconductor devices and three-dimensional integrated circuits. Some examples of bonding include wafer to wafer bonding, die to wafer bonding, and die to die bonding, fusion bonding, and hybrid bonding, among other examples.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
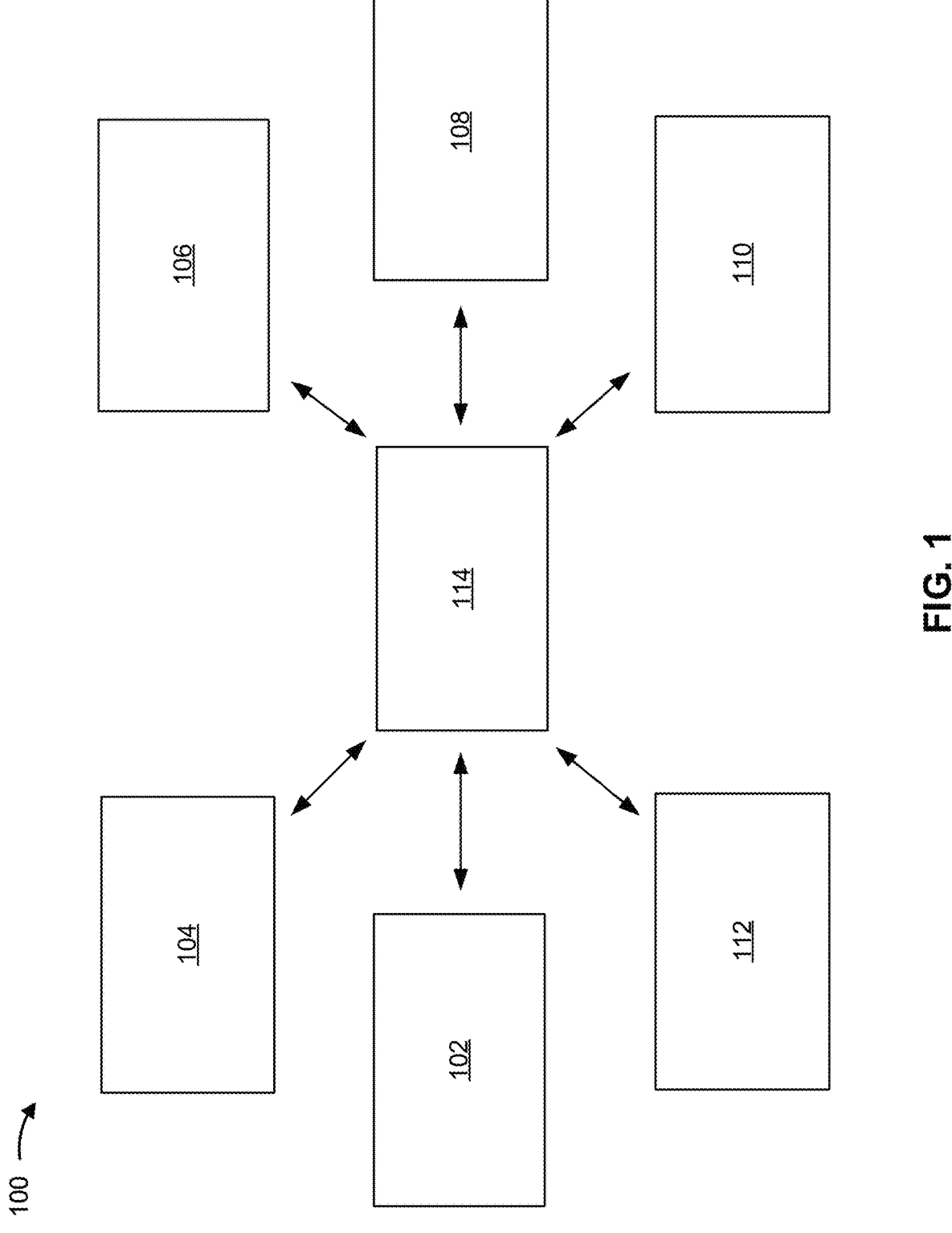
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A stacked semiconductor device is a semiconductor device that includes a plurality of semiconductor dies. Examples of stacked semiconductor devices include a system on integrated circuit (SoIC) device, a micro electromechanical system (MEMS) device, and a chip on wafer on substrate (CoWoS) device. A stacked semiconductor device accumulates heat during operation, which may decrease the performance of the stacked semiconductor device and/or may cause device failures.

Some implementations described herein provide a stacked semiconductor device that includes a cooling structure to increase the cooling efficiency of the stacked semiconductor device. The cooling structure includes various types of cooling components integrated into the stacked semiconductor device that are configured to remove and/or dissipate heat from the dies of the stacked semiconductor device. In this way, the cooling structure reduces device failures and permits the stacked semiconductor device to operate at greater voltages, greater speeds, and/or other increased performance parameters by removing and/or dissipating heat from the stacked semiconductor device.

FIG. 1 is a diagram of an example environment 100 in which systems and/or methods described herein may be implemented. As shown in FIG. 1, environment 100 may include a plurality of semiconductor processing tools 102-112 and a wafer/die transport tool 114. The plurality of semiconductor processing tools 102-112 may include a deposition tool 102, an exposure tool 104, a developer tool 106, an etch tool 108, a planarization tool 110, a plating tool 112, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

Wafer/die transport tool 114 includes a mobile robot, a robot arm, a tram or rail car, an overhead hoist transport (OHT) system, an automated materially handling system (AMHS), and/or another type of device that is used to transport wafers and/or dies between semiconductor processing tools 102-112 and/or to and from other locations such as a wafer rack, a storage room, and/or the like. In some implementations, wafer/die transport tool 114 may be a programmed device that is configured to travel a particular path and/or may operate semi-autonomously or autonomously.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of environment 100 may perform one or more functions described as being performed by another set of devices of environment 100.

Figure 2:
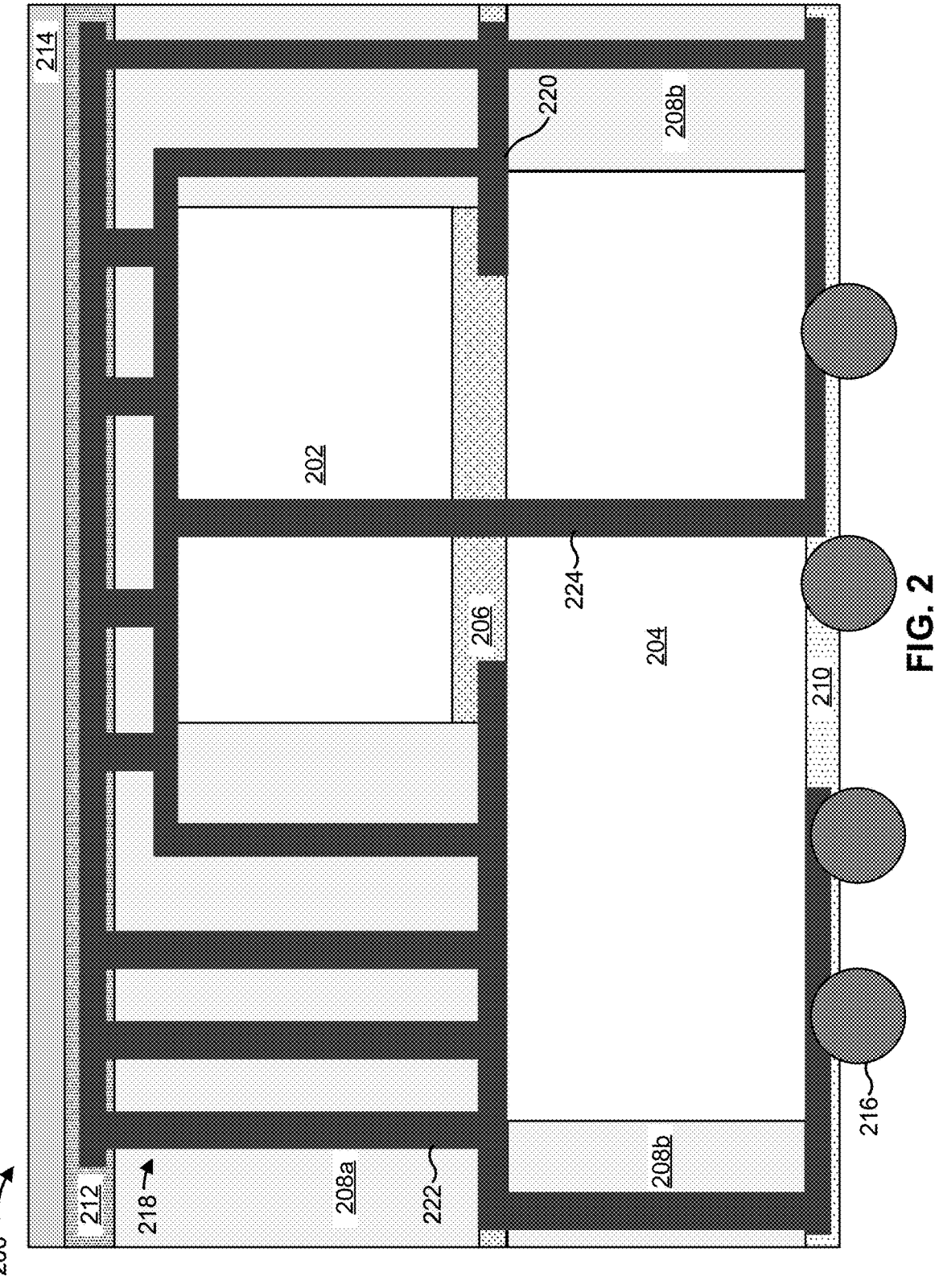
FIG. 2 is a diagram of an example stacked semiconductor device described herein.

FIG. 2 is a diagram of an example stacked semiconductor device 200 described herein. The stacked semiconductor device 200 includes an example of a stacked semiconductor device that includes a cooling structure integrated into the stacked semiconductor device. The stacked semiconductor device 200 includes a memory device (e.g., a static random access memory (SRAM), a dynamic random access memory (DRAM)), a logic device, a processor, an input/output device (e.g., an integrated fanout (InFo) device or another type of input/output device), an SoIC device, a chip on wafer on substrate (CoWoS) device, a three-dimensional inter-chip (3D IC) device, a micro electromechanical system (MEMS) device, and/or another type of semiconductor device in which dies are stacked or vertically arranged.

The stacked semiconductor device 200 includes stacked dies 202 and 204. Each of the die 202 and the die 204 includes a system on chip (SoC), a logic device, a sensor device, a processor device, and/or another type of semiconductor device. The die 202 and the die 204 are bonded together by a bonding layer (or bonding film) 206. The bonding layer 206 includes one or more types of materials such as a silicon oxide ($SiO_x$) (e.g., silicon dioxide ($SiO_2$)) and/or another type of bonding material. The die 202 and the die 204 may be bonded by a bonding technique such as hybrid bonding, fusion bonding, or direct bonding, among other examples.

Gaps on the sides of the die 202 and/or the die 204 are filled with dielectric layers such as tetraethyl orthosilicate (TEOS), a silicon oxide ($SiO_x$) (e.g., silicon dioxide ($SiO_2$)), silicon oxynitride (SiON), and/or another type of dielectric material. As an example, the gaps around the die 202 are filled with a dielectric layer 208*a*. As another example, the gaps around the die 204 are filed with a dielectric layers 208*b*. The dielectric layers 208*a* and 208*b* provide increased stability and electrical isolation for the dies 202 and 204.

The stacked semiconductor device 200 includes additional bonding layers, including a bonding layer 210 and a bonding layer 212, among other examples. In some implementations, the bonding layers 210 and 212 include the same material or materials. In some implementations, the bonding layers 210 and 212 include different materials. The bonding layer 212 may be used to bond the die 202 to a carrier substrate 214, which may include silicon or another carrier substrate material. The bonding layer 210 may be used to bond the stacked semiconductor device to solder balls (or solder bumps) 216, which may be used to bond the stacked semiconductor device 200 to an interposer structure or another device. In some implementations, the stacked semiconductor device 200 further includes a passivation layer between the die 204 and the bonding layer 210 to protect the die 204. The passivation layer may include a silicon nitride ($Si_xN_y$), an undoped silicate glass (USG), a silicon oxide ($SiO_x$) (e.g., silicon dioxide ($SiO_2$)), and/or another type of passivation material.

As further shown in FIG. 2, the stacked semiconductor device 200 includes a cooling structure 218. The cooling structure 218 is configured to remove and dissipate heat from the dies 202 and 204. In this way, the cooling structure 218 may decrease operating temperatures of the dies 202 and 204, may enable increased performance of the dies 202 and 204, and/or may increase reliability of the dies 202 and 204, among other examples. The cooling structure 218 includes an integrated cooling structure in that the cooling structure 218 is included in the semiconductor layers and structures of the stacked semiconductor device 200 (e.g., as opposed to being mounted or attached to outer surfaces of the stacked semiconductor device 200). In this way, the cooling structure 218 is formed during formation of the stacked semiconductor device 200.

The cooling structure 218 includes a plurality of heat removal structures 220, a plurality of heat dissipation structures 222, and an inter-die cooling structure 224. The heat removal structures 220, the heat dissipation structures 222, and the inter-die cooling structure 224 may include thermally conductive material(s) to enable the heat removal structures 220, the heat dissipation structures 222, and the inter-die cooling structure 224 to conduct heat away from the dies 202 and 204. Examples of thermally conductive materials include aluminum (Al), copper (Cu), tungsten (W), and/or a material having a thermal conductivity greater relative to a dielectric material such as silicon oxide ($SiO_x$), among other examples. However, other thermally conductive materials are within the scope of the present disclosure.

The heat removal structures 220 include heat spreaders, heat pipes, and/or other types of structures that conduct heat from the dies 202 and 204 and transfer the heat to the heat dissipation structures 222. As shown in FIG. 2, in some implementations, the heat removal structures 220 are arranged horizontally in the stacked semiconductor device 200 (e.g., in a horizontal plane of the stacked semiconductor device 200). The heat removal structures 220 may extend along the tops and bottoms of the dies 202 and 204 such that heat from the dies 202 and 204 is conducted through the tops and bottoms of the dies 202 and 204.

In some implementations, the heat removal structures 220 are solid structures that transfer heat away from the dies 202 and 204 through conduction. In some implementations, the heat removal structures 220 are hollow structures that transfer heat away from the dies 202 and 204 through convection. In these implementations, the heat is transferred through the heat removal structures 220 by a fluid such as air or a cooling liquid.

The heat dissipation structures 222 include heat dissipation columns, heat dissipation fins, heat dissipation pillars, heatsinks, and/or other types of heat dissipation structures that are configured to dissipate the heat that is transferred away from the dies 202 and 204 by the heat removal structures 220. The heat dissipation structures 222 may be configured to have a relatively large surface area (e.g., by including a plurality of fins or extensions) to increase the thermal capacity of the heat dissipation structures 222.

As shown in FIG. 2, in some implementations, the heat dissipation structures 222 are arranged vertically in the stacked semiconductor device 200 (e.g., in a vertical plane of the stacked semiconductor device 200 or in a plane that is approximately perpendicular to the plane of the heat removal structures 220). The heat dissipation structures 222 may be included in the dielectric layers 208a and 208b away from the dies 202 and 204 so as to reduce and/or minimize the thermal impact on the dies 202 and 204. In some implementations, a heat dissipation structure 222 is connected to (and receives heat from) a plurality of heat removal structures 220, which may be used to reduce the quantity of heat dissipation structures 222 in the stacked semiconductor device 200. In some implementations, a heat dissipation structure 222 is connected to (and receives heat from) a single heat removal structure 220, which may be used to increase the amount of heat that can be removed and dissipated from the dies 202 and 204.

The inter-die cooling structure 224 extends between and through the dies 202 and 204, as shown in FIG. 2. The inter-die cooling structure 224 also extends through the bonding layer 206 between the dies 202 and 204. The inter-die cooling structure 224 is configured to provide additional heat removal and dissipation for the dies 202 and 204. The inter-die cooling structure 224 is connected to one or more heat removal structures 220, such as a heat removal structure 220 located at or near a top of the die 202 and another heat removal structure 220 located at or near a bottom of the die 204. In some implementations, the stacked semiconductor device 200 includes a plurality of inter-die cooling structures 224 that extend between and through the dies 202 and 204 to further increase the cooling performance of the cooling structure 218.

In some implementations, the inter-die cooling structure 224 is a solid structure that transfers heat away from the dies 202 and 204 through conduction. In some implementations, the inter-die cooling structure 224 is a hollow structure that transfers heat away from the dies 202 and 204 through convection. In these implementations, the heat is transferred through the inter-die cooling structure 224 by a fluid such as air or a cooling liquid.

As indicated above, FIG. 2 is provided as an example. Other examples may differ from what is described with regard to FIG. 2.

Figure 3:
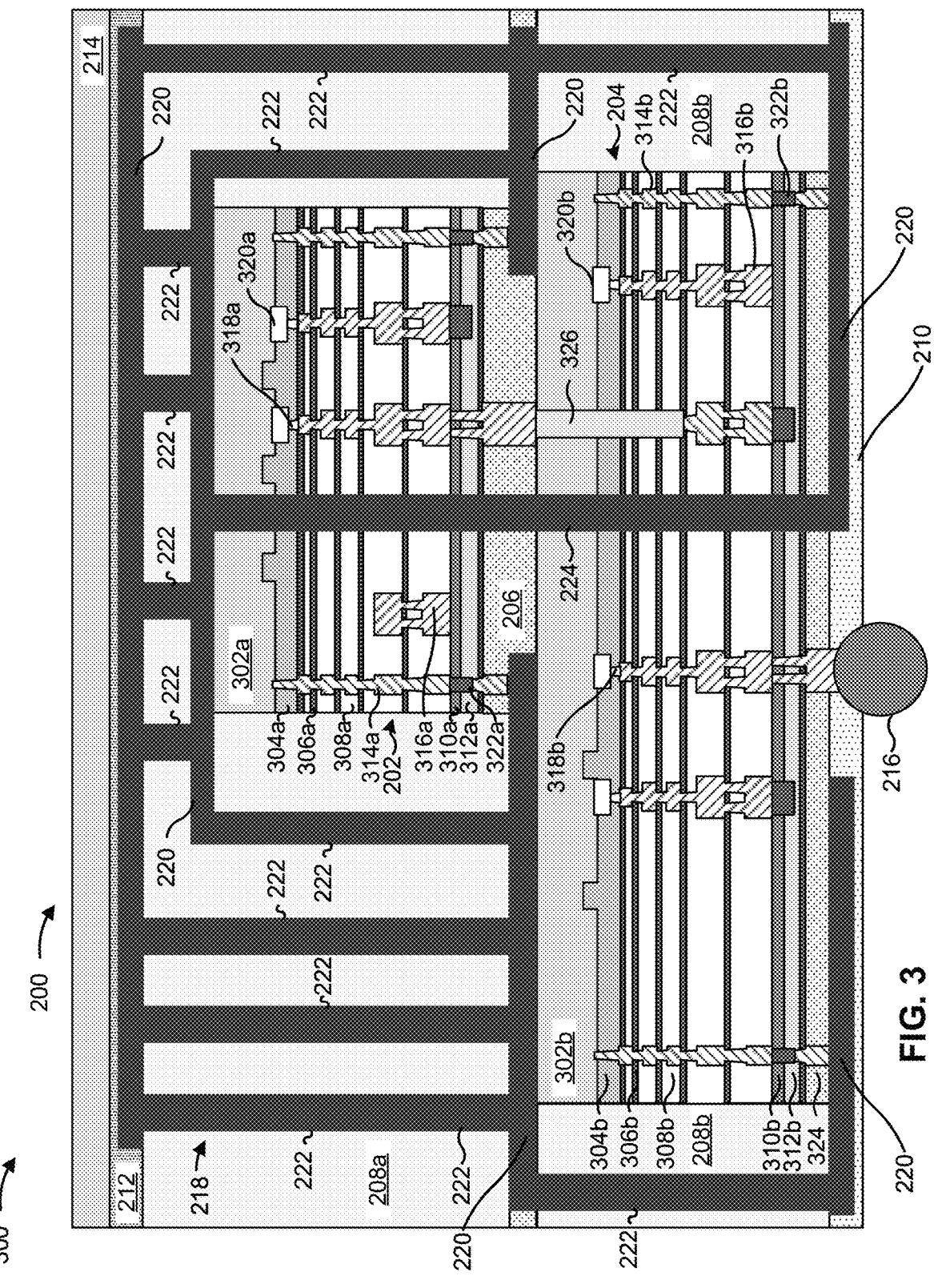
FIG. 3 is a diagram of an example portion described herein of the stacked semiconductor device of FIG. 2.

FIG. 3 is a diagram of a portion 300 described herein of the example stacked semiconductor device 200. The portion 300 includes an example of a portion of the stacked semiconductor device 200 that includes the cooling structure 218.

As shown in FIG. 3, the die 202 and the die 204 each includes a substrate (e.g., substrate 302a in the die 202 and substrate 302b in the die 204). The substrates 302a and 302b each includes a silicon (Si) substrate, a substrate formed of a material including silicon, a III-V compound semiconductor material substrate such as gallium arsenide (GaAs), a silicon on insulator (SOI) substrate, or another type of semiconductor substrate.

The die 202 and the die 204 each includes a plurality of stacked layers, including a front end of line (FEOL) inter-layer dielectric (ILD) layer (e.g., an FEOL ILD layer 304a on the substrate 302a and an FEOL ILD layer 304b on the substrate 302b). The stacked layers further include a plurality of alternating dielectric layers and etch stop layers (ESLs). As an example, the die 202 includes a plurality of alternating ESLs 306a and dielectric layers 308a that are included over and/or on the FEOL ILD layer 304a. Similarly, the die 204 includes a plurality of alternating ESLs 306b and dielectric layers 308b that are included over and/or on the FEOL ILD layer 304b. The ESLs 306a and 306b include layers of material that are configured to permit various portions of the dies 202 and 204 to be selectively etched or protected from etching to form one or more of the structures included in the dies 202 and 204. The dielectric layers 308a and 308b are included to electrically isolate various structures of the dies 202 and 204. The dielectric layers 308a and 308b include a silicon nitride ($Si_xN_y$), an oxide (e.g., a silicon oxide ($SiO_x$) and/or another oxide material), and/or another type of dielectric material.

The ESLs 306a and the dielectric layers 308a are included in a back end of line (BEOL) region of the die 202. Similarly, the ESLs 306b and the dielectric layers 308b are included in a BEOL region of the die 204. The die 202 includes a passivation layer 310a over and/or on the plurality of alternating dielectric layers 308a and ESLs 306a to passivate the BEOL region and to protect the BEOL region from upper layers of the die 202. The die 204 includes a passivation layer 310b over and/or on the plurality of alternating dielectric layers 308b and ESLs 306b to passivate the BEOL region and to protect the BEOL region from upper layers of the die 204.

A gap fill dielectric layer 312a is included in the die 202 over and/or on the passivation layer 310a and is covered with another ESL 306a. Similarly, a gap fill dielectric layer 312b is included in the die 204 over and/or on the passivation layer 310b and is covered with another ESL 306b. The die 202 includes a plurality of seal rings 314a to protect the die 202 from physical and/or electrical damage during a dicing operation to cut the die 202 from a wafer. The die 204 includes similar seal rings 314b.

As further shown in FIG. 3, the dies 202 and 204 include a plurality of circuits. The die 202 includes circuits 316a and the die 204 includes circuits 316b. In some implementations, one or more of the circuits 316b are connected to the solder balls 216 of the stacked semiconductor device 200. The circuits include metallization layers, vias, interconnects, and/or other types of conductive structures. The circuits are configured to transfer signals, voltages, current, and/or other electrical inputs and/or outputs to various areas of the die 202, the die 204, and/or other locations of the stacked semiconductor device 200. The circuits 316a and 316b include a conductive material such as tungsten (W), cobalt (Co), ruthenium (Ru), titanium (Ti), aluminum (Al), copper (Cu), gold (Au), and/or a combination thereof, among other examples of conductive materials.

The circuits are formed over and/or on contacts 318a and 318b. The contacts 318a and 318b include source/drain contacts (or MDs), gate contacts (or CBs, MPs), and/or other types of electrical contacts. The contacts 318a are configured to electrically connect the circuits 316a and transistors 320a included in the die 202. The contacts 318b are configured to electrically connect the circuits 316b and transistors 320b included in the die 204. The contacts 318a and 318b include a conductive material such as tungsten (W), cobalt (Co), ruthenium (Ru), titanium (Ti), aluminum (Al), copper (Cu), gold (Au), and/or a combination thereof, among other examples of conductive materials. The transistors 320a and 320b include planar transistors, fin field effect transistors (finFETs), gate all around (GAA) transistors, and/or other types of transistors.

Metal pads 322a are included over and/or on the circuits 316a and the seal rings 314a, and metal pads 322b are included over and/or on the circuits 316b and the seal rings 314b. The metal pads 322a and 322b may be configured to transfer signals, voltage, currents, and/or other electrical inputs/outputs between circuits of the die 202 and/or the die 204 included in the stacked semiconductor device 200. The metal pads 322a and 322b include aluminum (Al), aluminum copper (AlCu), and/or another conductive material. The die 204 further includes a bonding layer 324, which is used to bond the die 204 to a carrier substrate during manufacturing of the stacked semiconductor device 200.

As further shown in FIG. 3, the stacked semiconductor device 200 includes a die-to-die interconnect 326, which may include a die-to-die wire, a through substrate via (TSV), or another type of die-to-die interconnect. The die-to-die interconnect 326 physically connects to a circuit 316a of the die 202 and a circuit 316b of the die 204, and is configured to provide an electrical connection between the die 202 and the die 204. In this way, electrical inputs and outputs may be provided between the die 202 and the die 204 through the die-to-die interconnect 326. The die-to-die interconnect 326 includes a conductive material such as tungsten (W), cobalt (Co), ruthenium (Ru), titanium (Ti), aluminum (Al), copper (Cu), gold (Au), and/or a combination thereof, among other examples of conductive materials.

As further shown in FIG. 3, one or more of the heat removal structures 220 extend along the substrate 302a of the die 202, one or more of the heat removal structures 220 extend along the substrate 302b of the die 204, one or more of the heat removal structures 220 extend along the bonding layer 324 of the die 204, one or more of the heat removal structures 220 extend in and/or along the bonding layer 206, one or more of the heat removal structures 220 extend in and/or along the bonding layer 210, and/or one or more of the heat removal structures 220 extend in and/or along the bonding layer 212, among other examples.

As further shown in FIG. 3, one or more of the heat dissipation structures 222 extend between a heat removal structure 220 in the bonding layer 210 and a heat removal structure 220 in the bonding layer 206, one or more of the heat dissipation structures 222 extend between a heat removal structure 220 in the bonding layer 212 and a heat removal structure 220 in the bonding layer 206, and/or one or more of the heat dissipation structures 222 extend between a heat removal structure 220 in the bonding layer 212 and a heat removal structure 220 above the die 202, among other examples.

As indicated above, FIG. 3 is provided as an example. Other examples may differ from what is described with regard to FIG. 3.

Figure 4A:
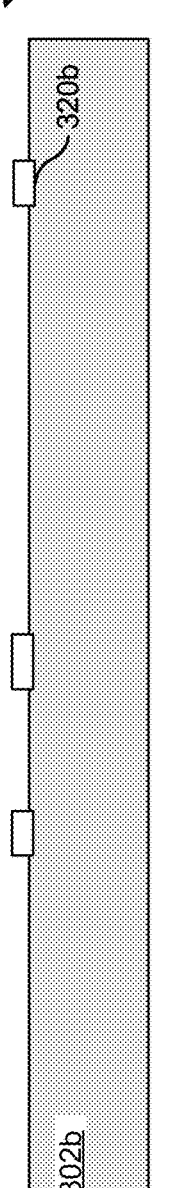
FIGS. 4A-4T are diagrams of an example implementation described herein.
Figure 4A:
Figure 4B:
Figure 4B:
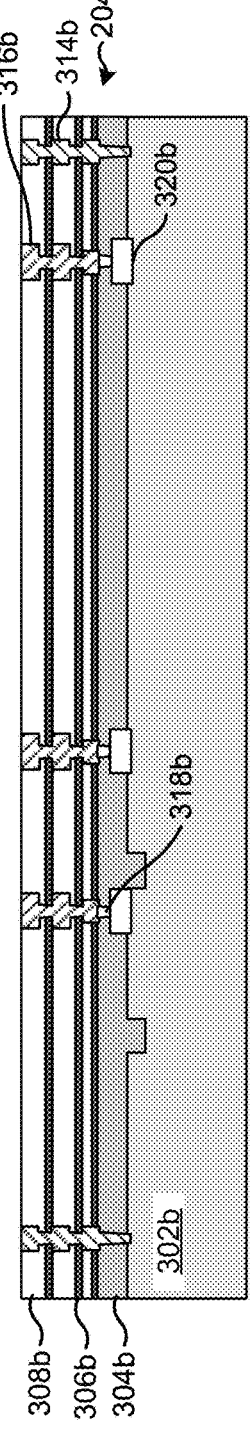
Figure 4B:
Figure 4C:
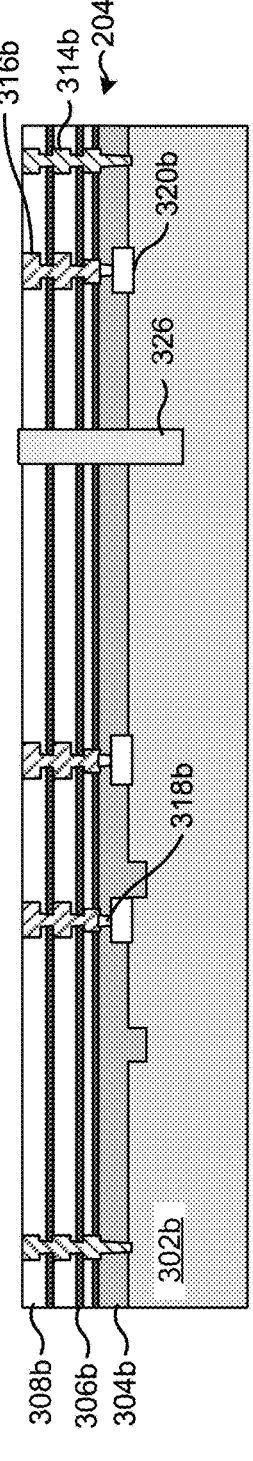
Figure 4D:
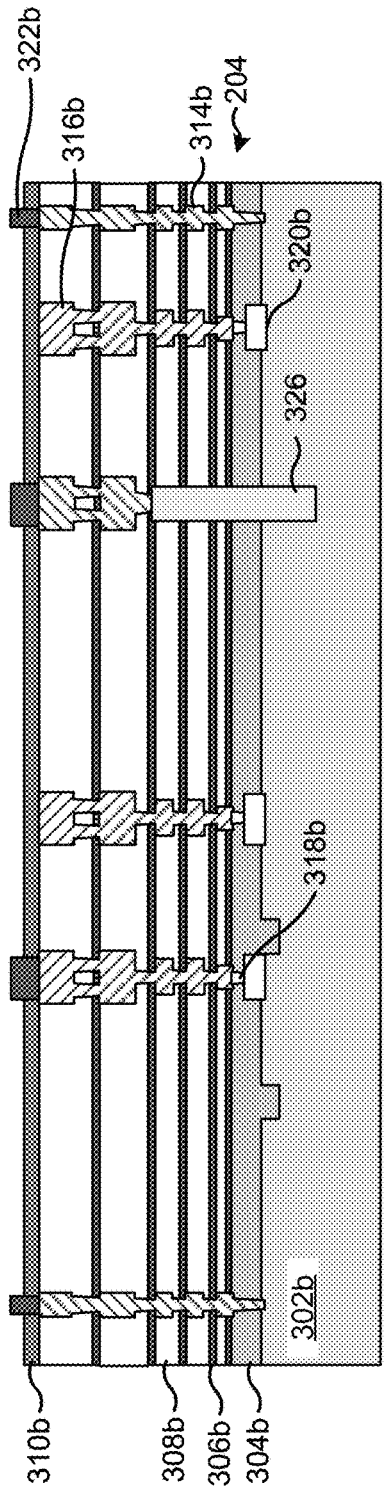
Figure 4E:
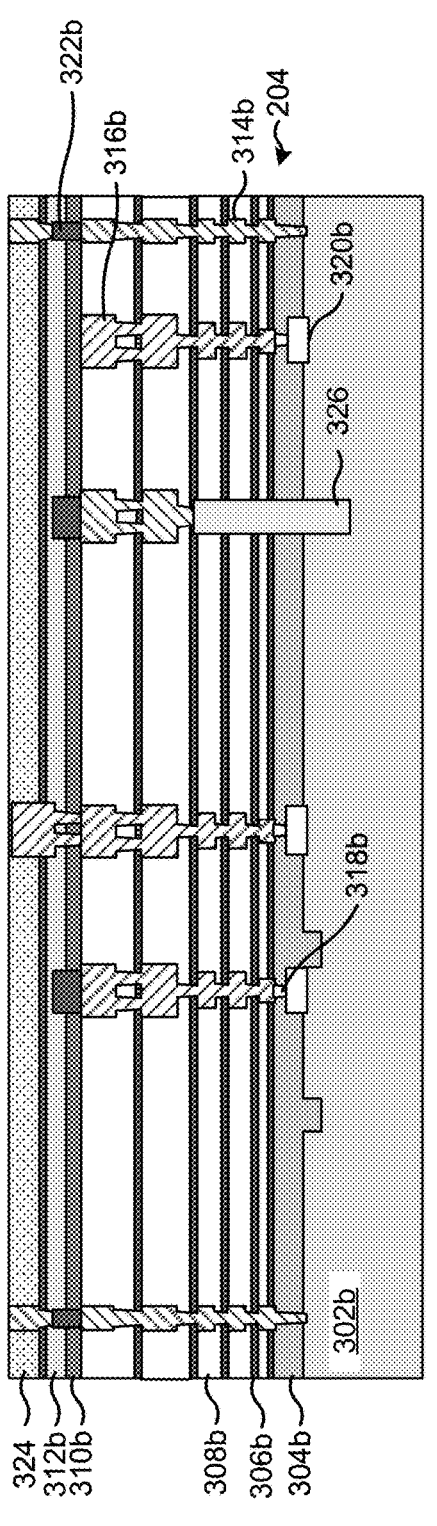
Figure 4F:
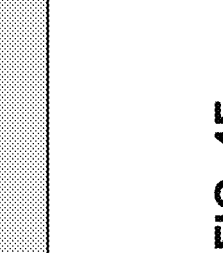
Figure 4G:
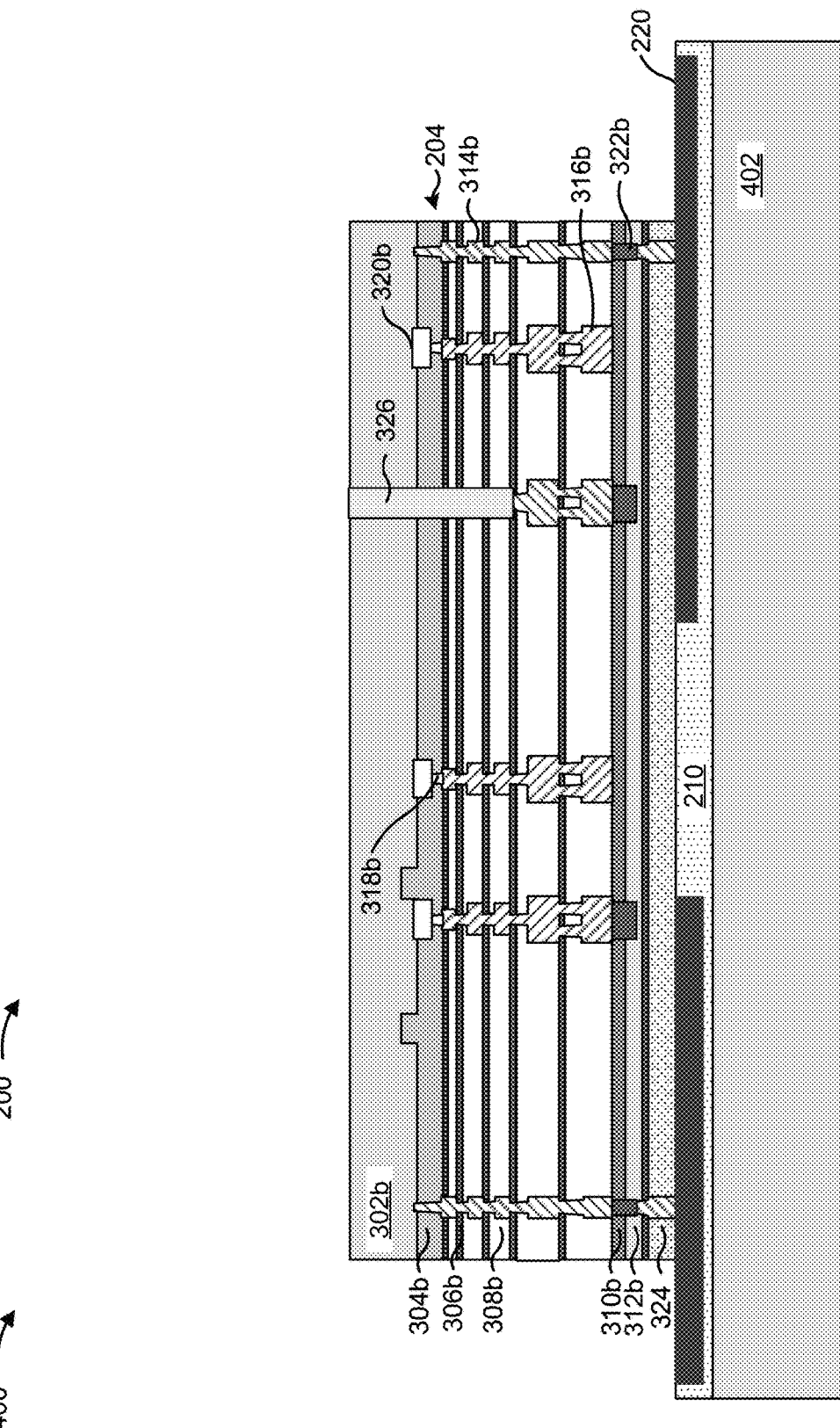
Figure 4H:
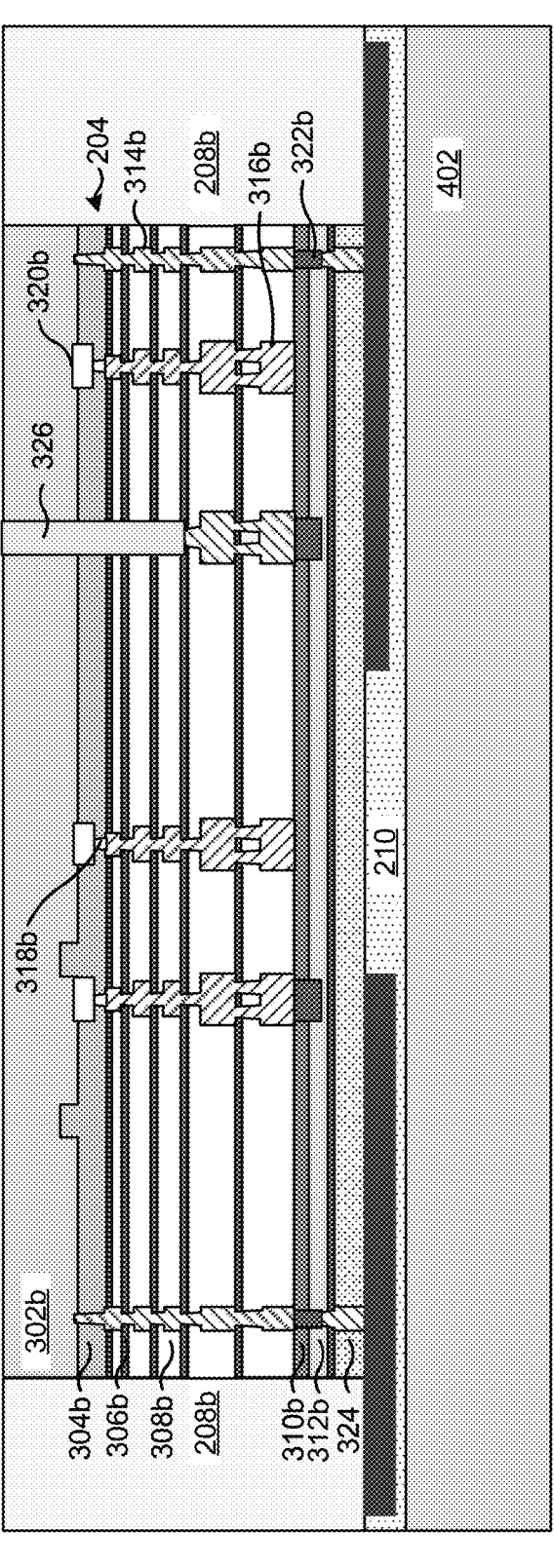
Figure 4I:
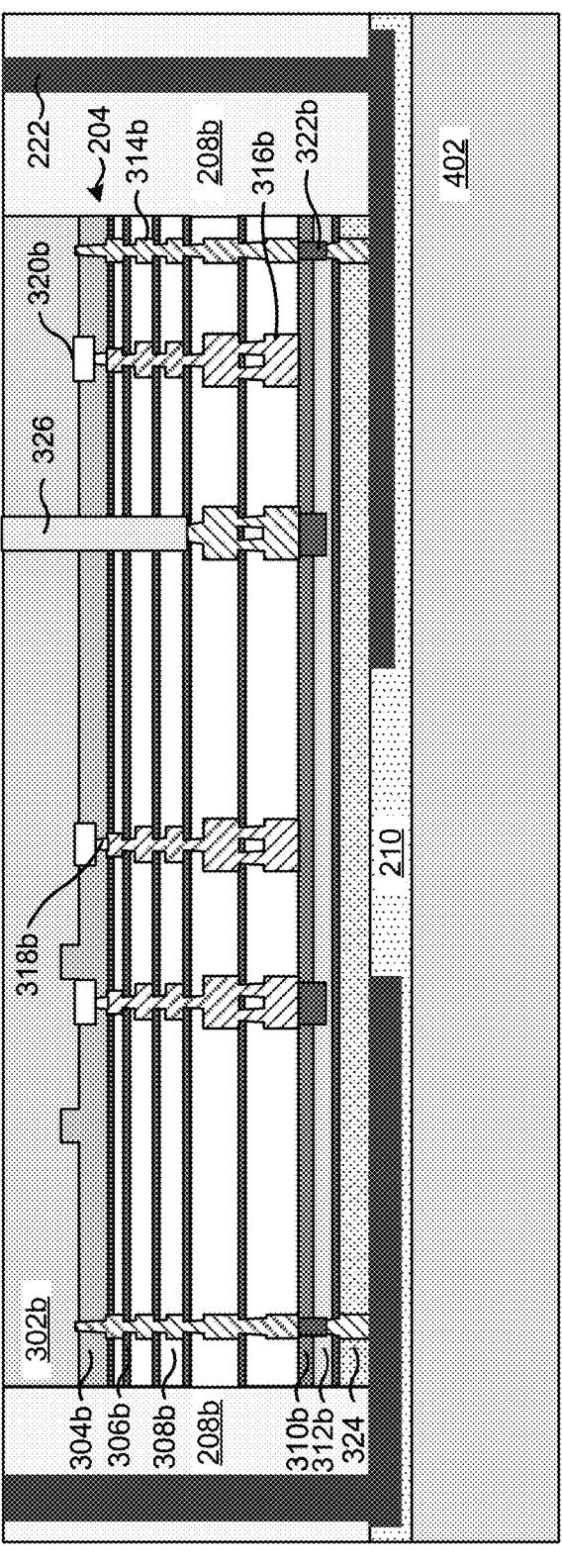
Figure 4J:
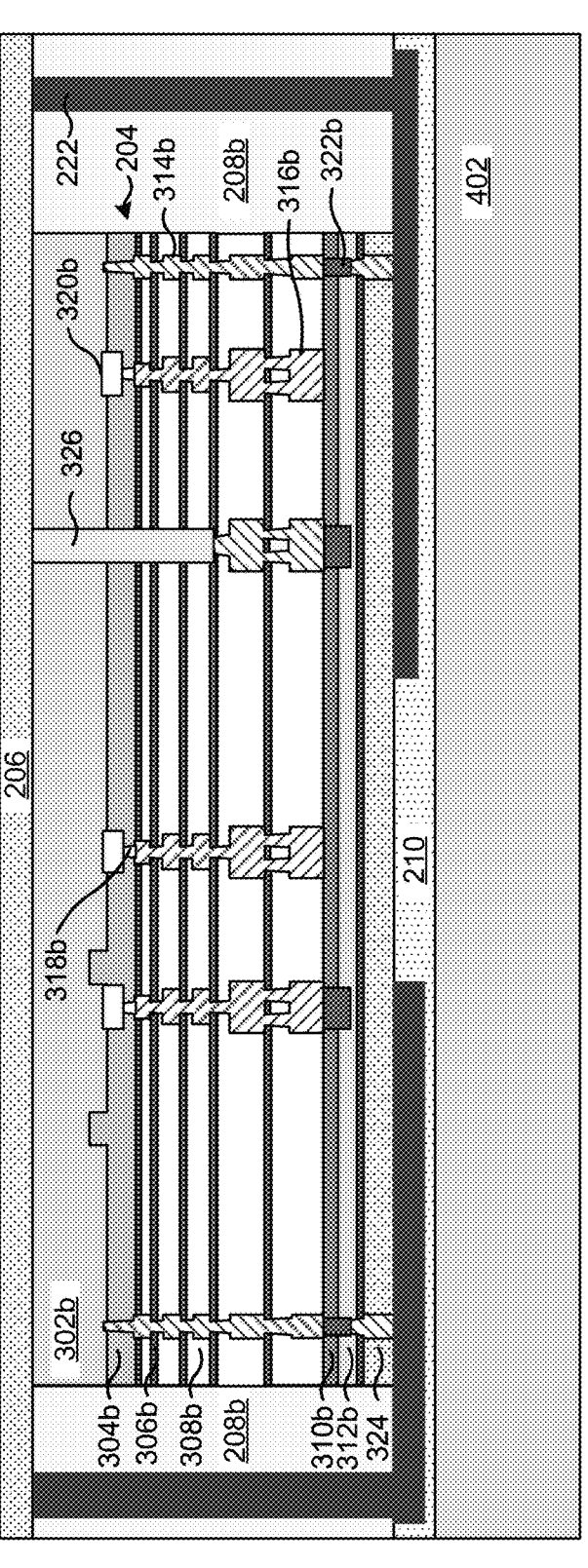
Figure 4K:
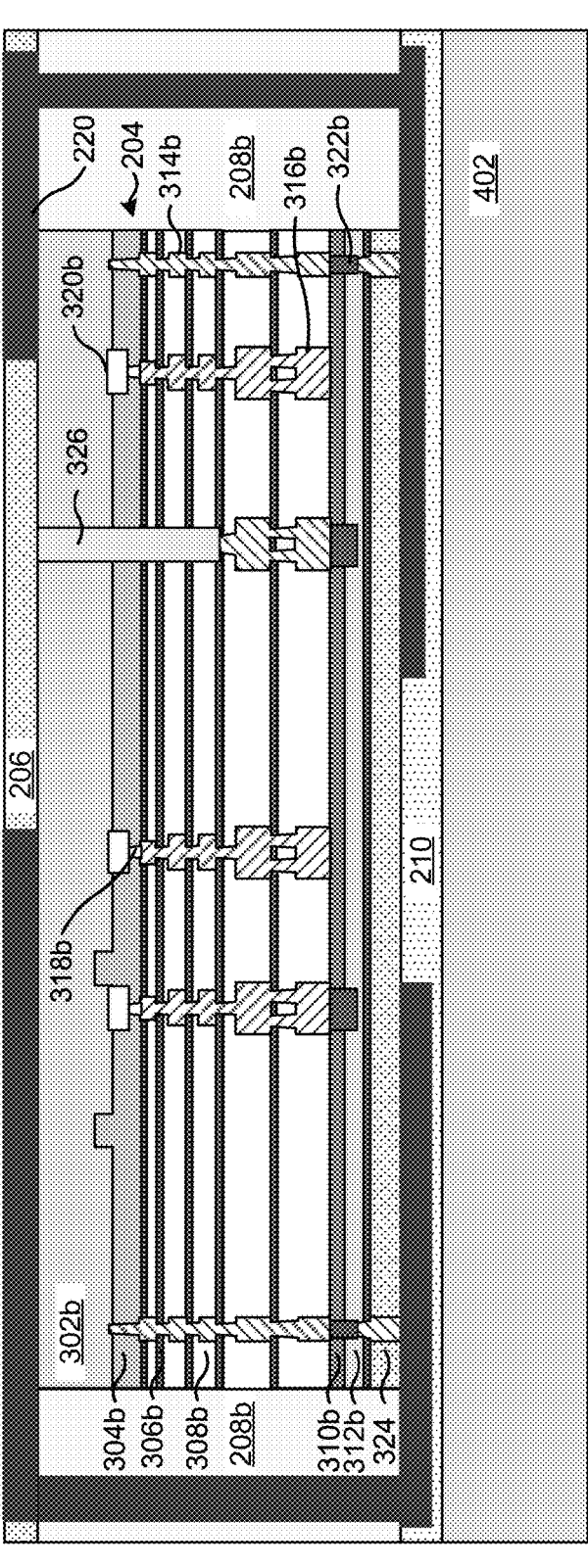
Figure 4L:
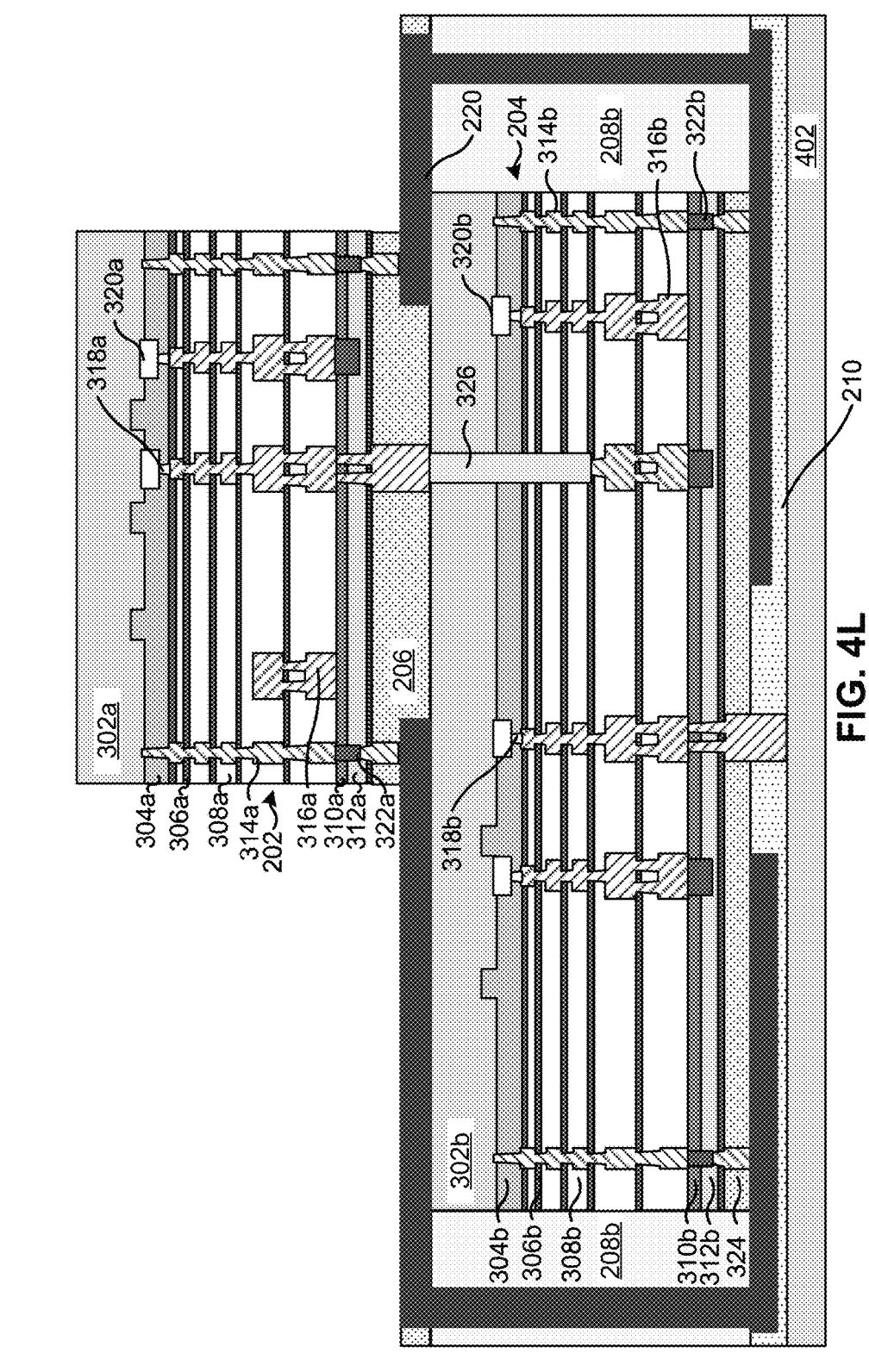
Figure 4M:
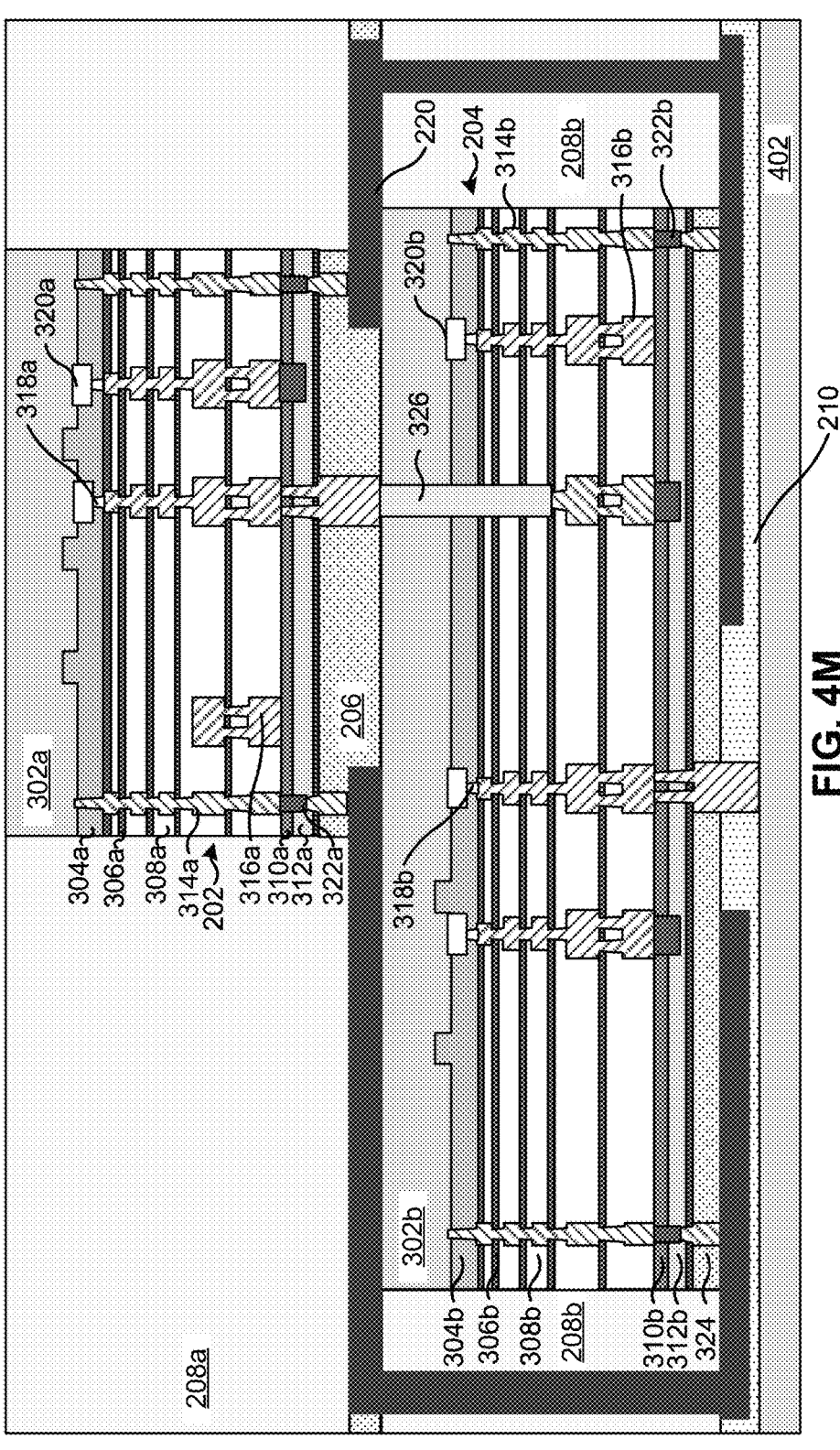
Figure 4N:
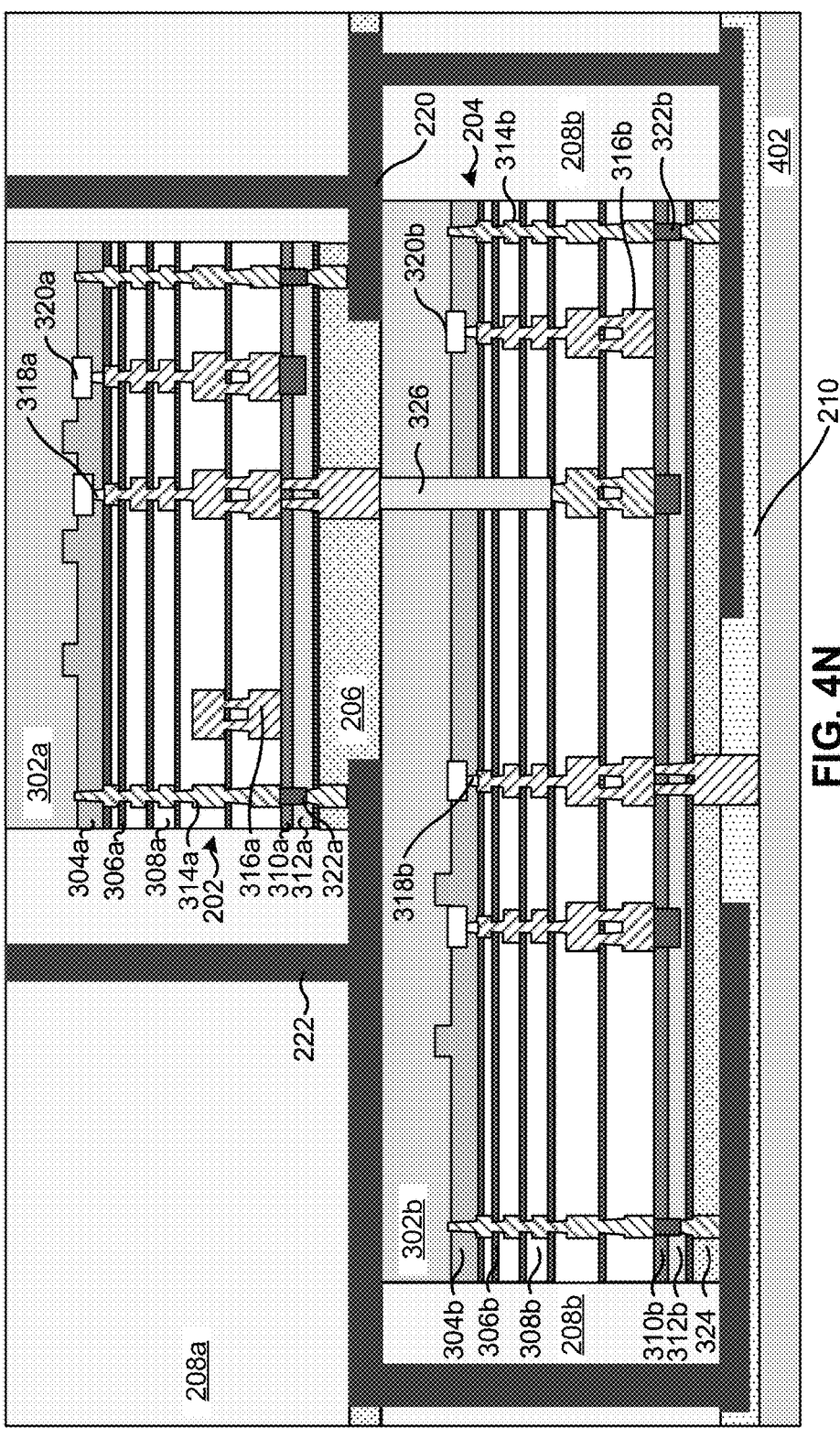
Figure 4O:
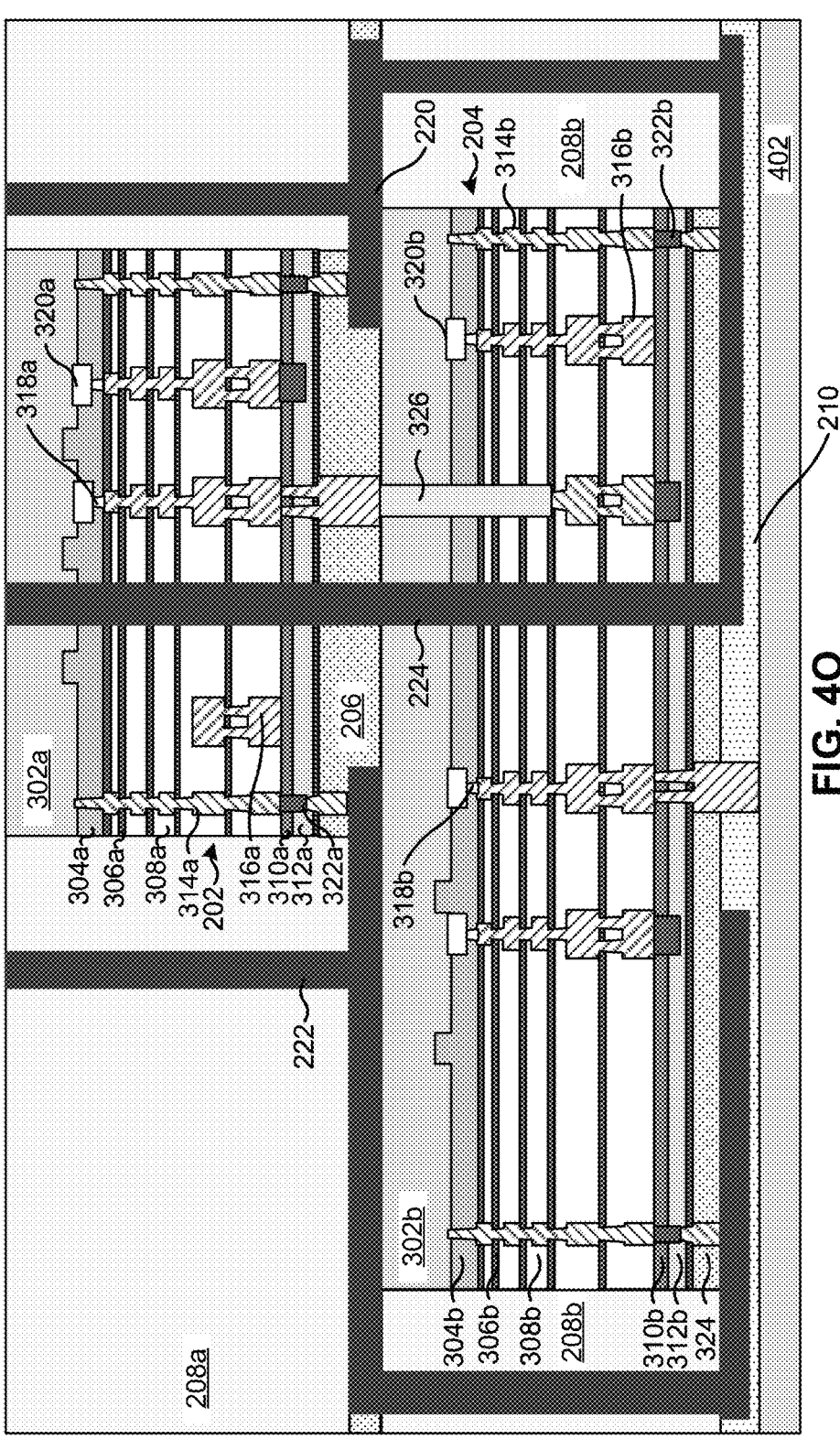
Figure 4P:
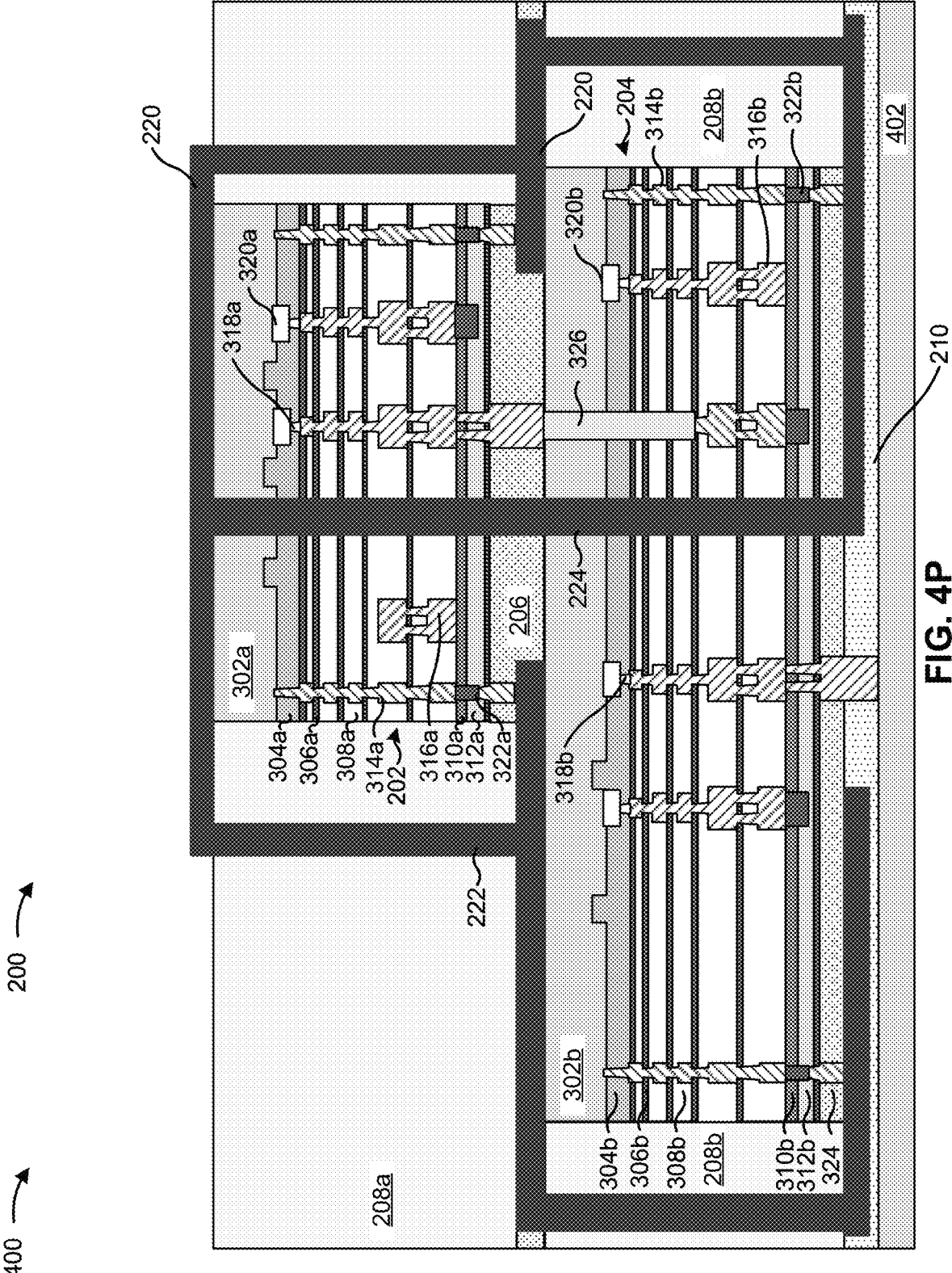
Figure 4Q:
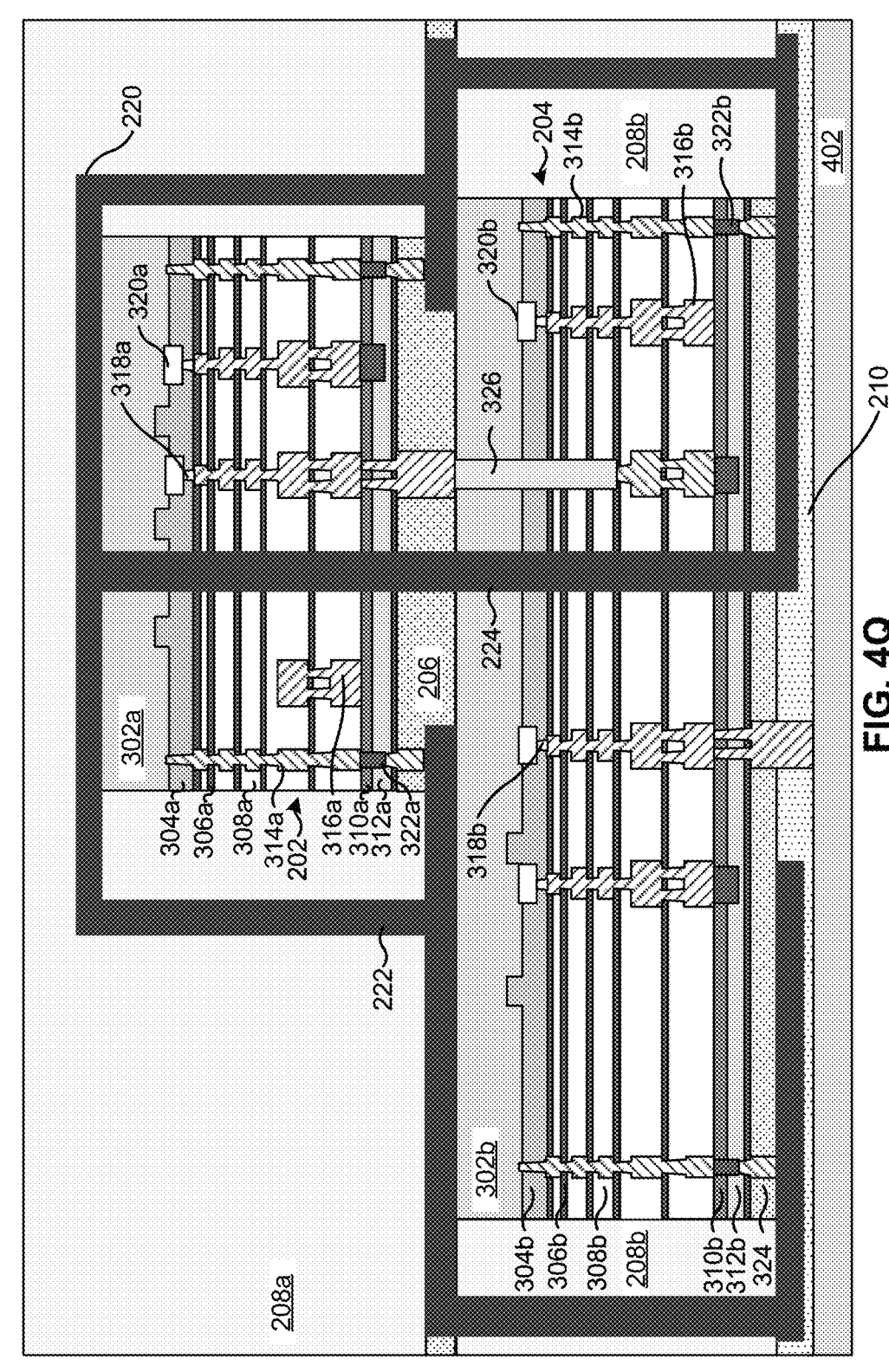
Figure 4R:
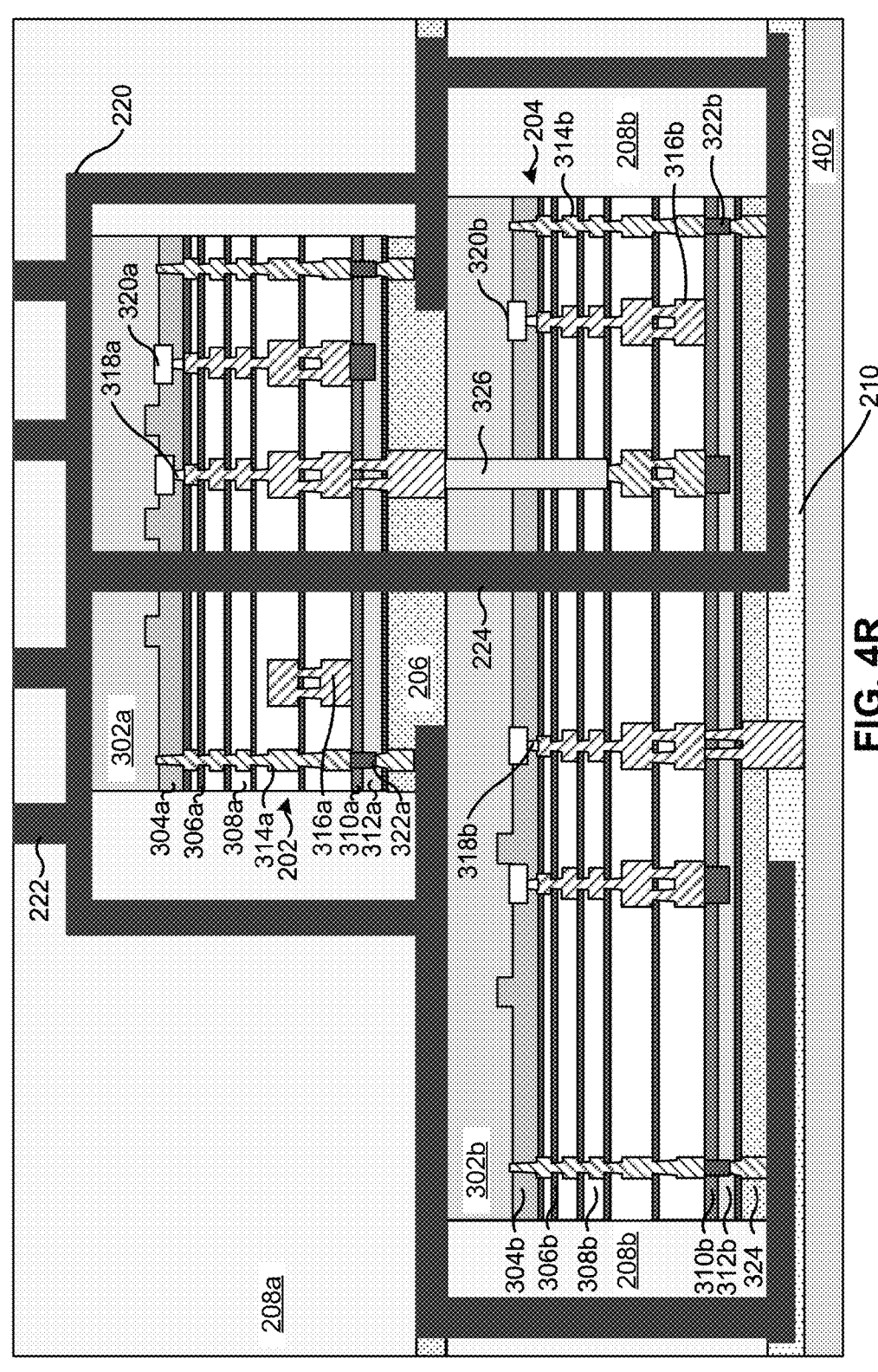
Figure 4S:
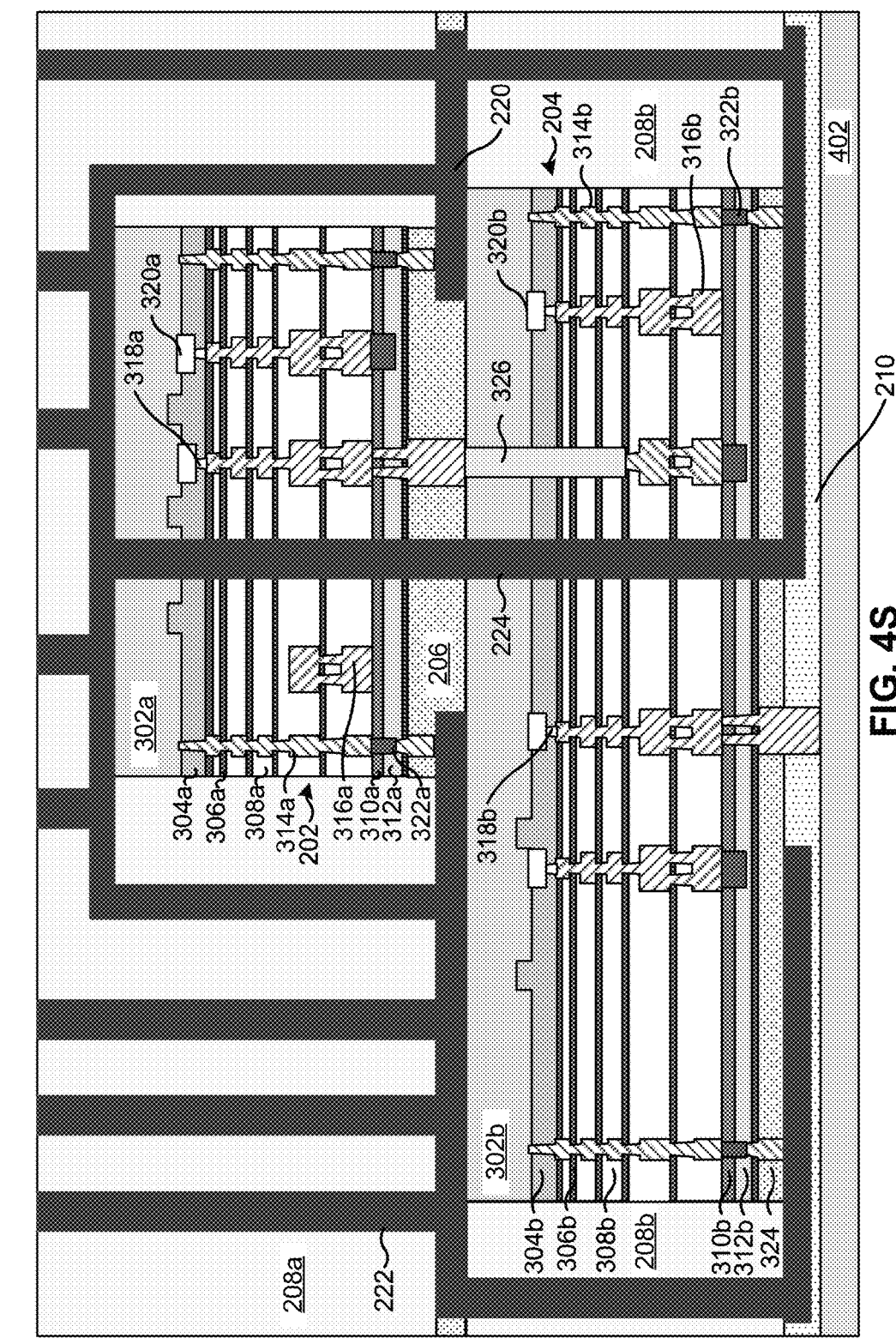
Figure 4T:
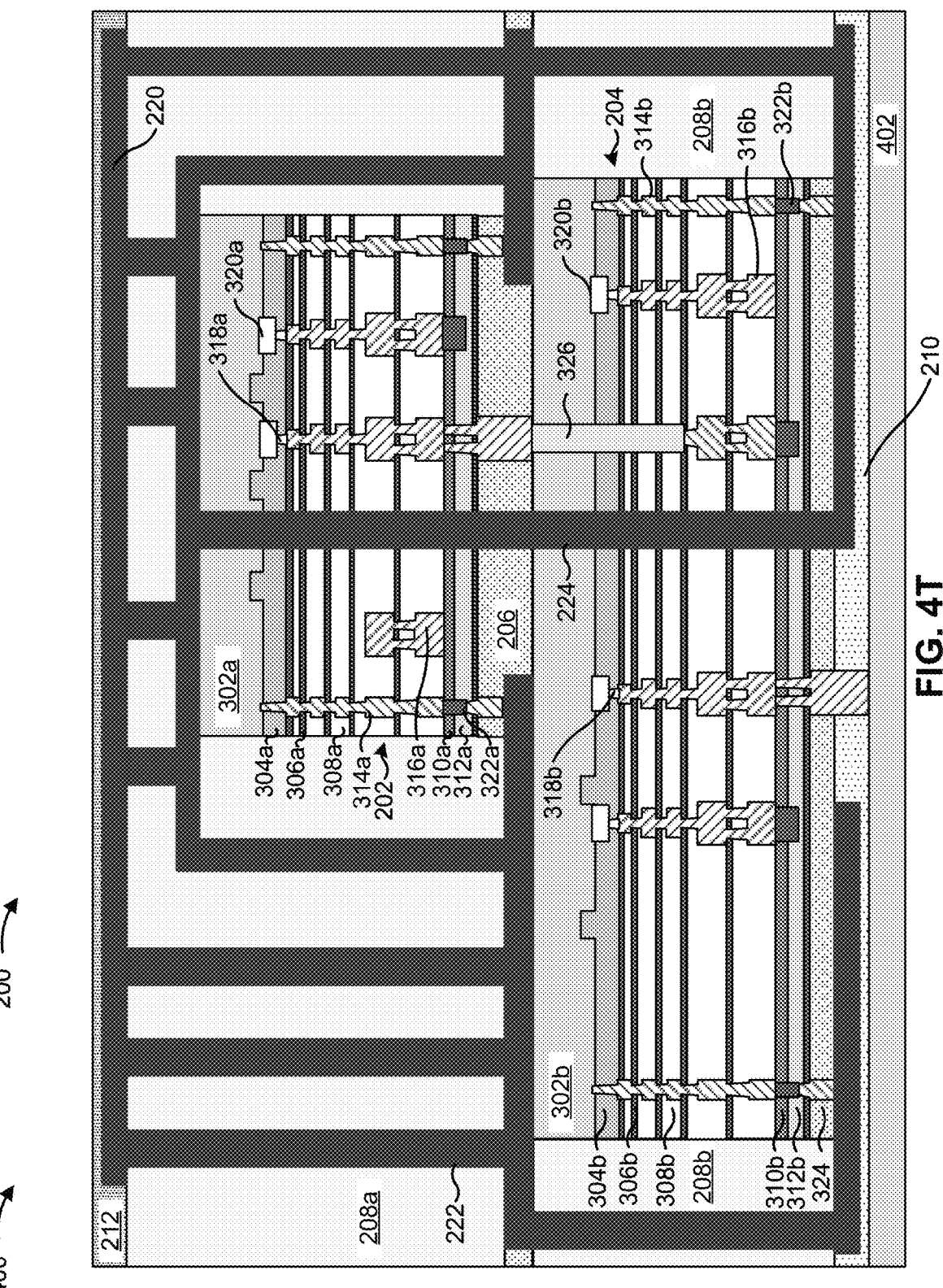

FIGS. 4A-4T are diagrams of an example implementation 400 described herein. The example implementation 400 includes a plurality of examples of forming the stacked semiconductor device 200 including the cooling structure 218.

FIGS. 4A-4E are diagrams of an example process for forming the die 204 (or a portion thereof, such as portion 300). However, other processes and techniques may be used to form the die 204. Turning to FIG. 4A, the transistors 320b are formed in and/or on the substrate 302b. One or more of the semiconductor processing tools 102-112 may form one or more portions of the transistors 320b. The deposition tool 102 may use various deposition techniques to deposit layers of the transistors 320b, to deposit photoresist layers for etching the substrate 302b and/or portions of the deposited layers. The exposure tool 104 may expose the photoresist layers to form patterns in the photoresist layers. The developer tool 106 may develop the patterns in the photoresist layers. The etch tool 108 may etch the substrate 302*b* and/or portions of the deposited layers to form the structures of the transistors 320*b*. The planarization tool 110 may planarize portions of the transistors 320*b*. The plating tool 112 may deposit metal structures and/or layers of the transistors 320*b*.

As shown in FIG. 4B, the deposition tool 102 deposits an FEOL ILD layer 304*b* over and/or on the substrate 302*b*. The deposition tool 102 also deposits alternating layers of ESLs 306*b* and dielectric layers 308*b*. The deposition tool 102, the exposure tool 104, the developer tool 106, and the etch tool 108 performs various operations to form the contacts 318*b*, portions of the seal rings 314*b*, and portions of the circuits 316*b*.

As shown in FIG. 4C, the die-to-die interconnect 326 is formed in portions of the substrate 302*b*, the FEOL ILD layer 304*b*, and the alternating layers of ESLs 306*b* and dielectric layers 308*b*. In some implementations, a pattern in a photoresist layer is used to form the die-to-die interconnect 326. In these implementations, the deposition tool 102 forms the photoresist layer on the top dielectric layer 308*b*. The exposure tool 104 exposes the photoresist layer to a radiation source to pattern the photoresist layer. The developer tool 106 develops and removes portions of the photoresist layer to expose the pattern. The etch tool 108 etches through the alternating layers of ESLs 306*b* and dielectric layers 308*b*, through the FEOL ILD layer 304*b*, and into a portion of the substrate 302*b* to form an opening or recess. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the opening or recess based on a pattern. The deposition tool 102 and/or the plating tool 112 may fill the opening or recess with a conductive material to form the die-to-die interconnect 326.

As shown in FIG. 4D, one or more of the semiconductor processing tools 102-112 form additional alternating layers of ESLs 306*b* and dielectric layers 308*b*, additional portions of the seal rings 314*b*, and additional portions of the circuits 316*b*. Moreover, the deposition tool 102 and/or the plating tool 112 forms the passivation layer 310*b* over and/or on the top dielectric layer 308*b*, and the metal pads 322*b* over and/or on the seal rings 314*b* and the circuits 316*b*.

As shown in FIG. 4E, one or more of the semiconductor processing tools 102-112 form additional portions of the seal rings 314*b* and additional portions of one or more of the circuits 316*b*. Moreover, the deposition tool 102 forms the gap fill dielectric layer 312*b* over and/or on the passivation layer 310*b*, an ESL 306*b* over and/or on the passivation layer 310*b*, and the bonding layer 324 over and/or on the ESL 306*b*. The bonding layer 324 may include a hybrid bonding layer or another type of bonding layer. The bonding layer 324 includes one or more types of materials such as a silicon oxide ($SiO_x$) (e.g., silicon dioxide ($SiO_2$)) and/or another type of bonding material.

As shown in FIG. 4F, a carrier substrate 402 (e.g., a silicon substrate or another type of carrier substrate) is prepared for the die 204. The carrier substrate 402 and the die 204 are configured to be bonded by the bonding layer 210 over and/or on the substrate 402 and the bonding layer 324. In some implementations, the deposition tool 102 deposits the bonding layer 210 over and/or on the carrier substrate 402. In some implementations, the planarization tool 110 planarizes the bonding layer 210.

As further shown in FIG. 4F, one or more heat removal structures 220 are formed in and/or on the bonding layer 210. In some implementations, the etch tool 108 etches portions of the bonding layer 210, and the deposition tool 102 and/or the plating tool 112 deposit the one or more heat removal structures 220 in the etched portions of the bonding layer 210.

As shown in FIG. 4G, the die 204 is bonded to a carrier substrate 402 using the bonding layers 210 and 324. Accordingly, the die 204 may be flipped or rotated 180 degrees to bond the die 204 to the carrier substrate 402. The die 204 is bonded to the carrier substrate 402 such that at least a portion of the die 204 is arranged over and/or on portions of the one or more heat removal structures 220 in and/or on the bonding layer 210. The die 204 and the carrier substrate 402 are bonded by a fusion bonding technique, a hybrid bonding technique, and/or another bonding technique.

As shown in FIG. 4H, areas above the carrier substrate 402 around the die 204 are filled with the dielectric layer 208*b*. In particular, the deposition tool 102 deposits the dielectric layer 208*b* over portions of the carrier substrate 402 around the die 204.

As shown in FIG. 4I, one or more heat dissipation structures 222 are formed around the die 204 in the dielectric layer 208*b*. In some implementations, the one or more heat dissipation structures 222 are formed such that the one or more heat dissipation structures 222 are connected to the one or more heat removal structures 220 in and/or on the bonding layer 210. In some implementations, the etch tool 108 etches portions of the dielectric layer 208*b*, and the deposition tool 102 and/or the plating tool 112 deposit the one or more heat dissipation structures 222 in the etched portions of the dielectric layer 208*b*.

As shown in FIG. 4J, the bonding layer 206 is formed over and/or on the die 204. Moreover, the bonding layer 206 is formed over and/or on the dielectric layer 208*b* and over and/or on the one or more heat dissipation structures 222 in the dielectric layer 208*b*. The deposition tool 102 may deposit the bonding layer 206 over and/or on the die 204, over and/or on the dielectric layer 208*b*, and over and/or on the one or more heat dissipation structures 222.

As shown in FIG. 4K, one or more heat removal structures 220 are formed in and/or on the bonding layer 206 above one or more portions of the die 204. In some implementations, the one or more heat removal structures 220 are formed such that the one or more heat removal structures 220 in and/or on the bonding layer 206 are connected to the one or more heat dissipation structures 222 in the dielectric layer 208*b*. In some implementations, the etch tool 108 etches portions of the bonding layer 206, and the deposition tool 102 and/or the plating tool 112 deposit the one or more heat removal structures 220 in the etched portions of the bonding layer 206.

As shown in FIG. 4L, the die 202 and the die 204 are bonded using the bonding layer 206 (and, in some cases, another bonding layer on the die 202). The die 202 and the die 204 are bonded by a fusion bonding technique, a hybrid bonding technique, and/or another bonding technique. In some implementations, the die 202 is formed by similar techniques and operations as described above in FIGS. 4A-4E to include the substrate 302*a*, the FEOL ILD layer 304*a*, the plurality of alternating ESLs 306*a* and dielectric layers 308*a*, the passivation layer 310*a*, the gap fill dielectric layer 312*a*, the seal rings 314*a*, the circuits 316*a*, the contacts 318*a*, the transistors 320*a*, and the metal pads 322*a*.

As shown in FIG. 4M, areas above the die 204 around the die 202 are filled with a first portion of the dielectric layer 208a. In particular, the deposition tool 102 deposits the first portion of the dielectric layer 208a over portions of the die 204 around the die 202, and over and/or on portions of the one or more heat removal structures 220 in and/or on the bonding layer 206.

As shown in FIG. 4N, one or more heat dissipation structures 222 are formed around the die 202 in the dielectric layer 208a. The one or more heat dissipation structures 222 are formed such that the one or more heat dissipation structures 222 are connected to the one or more heat removal structures 220 in and/or on the bonding layer 206. In some implementations, the etch tool 108 etches portions of the dielectric layer 208a, and the deposition tool 102 and/or the plating tool 112 deposit the one or more heat dissipation structures 222 in the etched portions of the dielectric layer 208a.

As shown in FIG. 4O, the inter-die cooling structure 224 is formed in and through the dies 202 and 204. In some implementations, the inter-die cooling structure 224 is formed such that the inter-die cooling structure 224 connects to a heat removal structure 220 in and/or on the bonding layer 210.

In some implementations, a pattern in a photoresist layer is used to form an opening for the inter-die cooling structure 224. In these implementations, the deposition tool 102 forms the photoresist layer on the dielectric layer 308a and on the substrate 302a. The exposure tool 104 exposes the photoresist layer to a radiation source to pattern the photoresist layer. The developer tool 106 develops and removes portions of the photoresist layer to expose the pattern. The etch tool 108 etches the opening through the substrate 302a, through the FEOL ILD layer 304a, through the alternating layers of ESLs 306a and dielectric layers 308a, through the passivation layer 310a, through the gap fill dielectric layer 312a and the ESL 306a under the gap fill dielectric layer 312a, and through the bonding layer 206 into the die 204. Moreover, the etch tool 108 etches the opening through the substrate 302b, through the FEOL ILD layer 304b, through the alternating layers of ESLs 306b and dielectric layers 308b, through the passivation layer 310b, through the gap fill dielectric layer 312b and the ESL 306b under the gap fill dielectric layer 312b, and through the bonding layer 324 to the heat removal structure 220 in and/or on the bonding layer 210. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the opening or recess based on a pattern. The deposition tool 102 and/or the plating tool 112 may fill the opening or recess with a conductive material to form the inter-die cooling structure 224.

The deposition tool 102 and/or the plating tool 112 deposit the inter-die cooling structure 224 in the opening. In some implementations, the planarization tool 110 planarizes the inter-die cooling structure 224 after the inter-die cooling structure 224 is deposited.

As shown in FIG. 4P, one or more heat removal structures 220 are formed in and/or on the dielectric layer 208a and above the die 202. In some implementations, the one or more heat removal structures 220 are formed such that the one or more heat removal structures 220 in and/or on the dielectric layer 208a and over the die 202 are connected to the one or more heat dissipation structures 222 in the dielectric layer 208a. In some implementations, the etch tool 108 etches portions of the dielectric layer 208a and the deposition tool 102 and/or the plating tool 112 deposit the one or more heat removal structures 220 in the etched portions of the dielectric layer 208a. In some implementations, the deposition tool 102 and/or the plating tool 112 deposit the one or more heat removal structures 220 over and/or on the dielectric layer 208a and over and/or on the substrate 302a of the die 202.

As shown in FIG. 4Q, a second portion of the dielectric layer 208a is formed over and/or on the first portion of the dielectric layer 208a. Moreover, the second portion of the dielectric layer 208a is formed over and/or on the one or more heat removal structures 220 that are located over and/or on the first portion of the dielectric layer 208a and located over and/or on the substrate 302a of the die 202. In particular, the deposition tool 102 deposits the second portion of the dielectric layer 208a.

As shown in FIG. 4R, one or more heat dissipation structures 222 are formed in the dielectric layer 208a above the die 202. In particular, the one or more heat dissipation structures 222 are formed such that the one or more heat dissipation structures 222 are connected to the one or more heat removal structures 220 that are located over and/or on the substrate 302a of the die 202. In some implementations, the etch tool 108 etches portions of the dielectric layer 208a, and the deposition tool 102 and/or the plating tool 112 deposit the one or more heat dissipation structures 222 in the etched portions of the dielectric layer 208a.

As shown in FIG. 4S, one or more heat dissipation structures 222 are formed in the dielectric layer 208a around the die 202. In particular, the one or more heat dissipation structures 222 are formed such that the one or more heat dissipation structures 222 are connected to the one or more heat removal structures 220 that are located in and/or on the bonding layer 206. In some implementations, the etch tool 108 etches portions of the dielectric layer 208a, and the deposition tool 102 and/or the plating tool 112 deposit the one or more heat dissipation structures 222 in the etched portions of the dielectric layer 208a.

As shown in FIG. 4T, one or more heat removal structures 220 are formed in, over, and/or on the dielectric layer 208a. In particular, the one or more heat removal structures 220 are formed such that the one or more heat removal structures 220 are connected to one or more of the heat dissipation structures 222 in the dielectric layer 208a. In some implementations, the deposition tool 102 and/or the plating tool 112 deposit the one or more heat removal structures 220 in, over, and/or on the dielectric layer 208a. Moreover, the deposition tool 102 may deposit the bonding layer 212 over and/or on the dielectric layer 208a, and over and/or on the one or more heat removal structures 220 that are over and/or on the dielectric layer 208a.

As indicated above, FIGS. 4A-4T are provided as examples. Other examples may differ from what is described with regard to FIGS. 4A-4T.

Figure 5B:
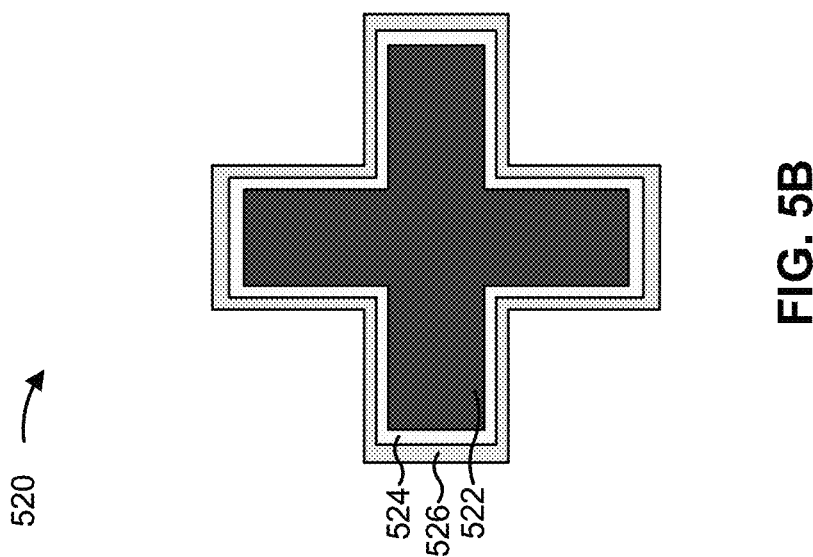
FIGS. 5A-5C are diagrams of example cooling component configurations of a cooling structure described herein.
Figure 5A:
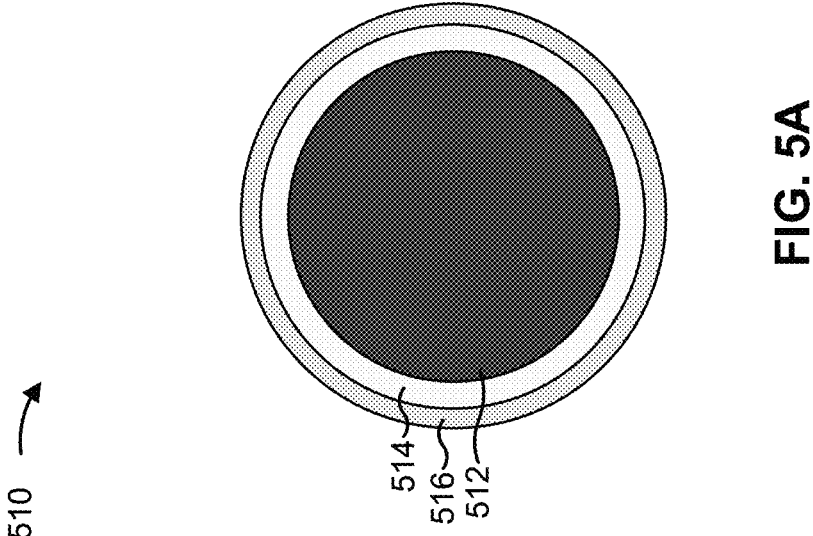
Figure 5C:
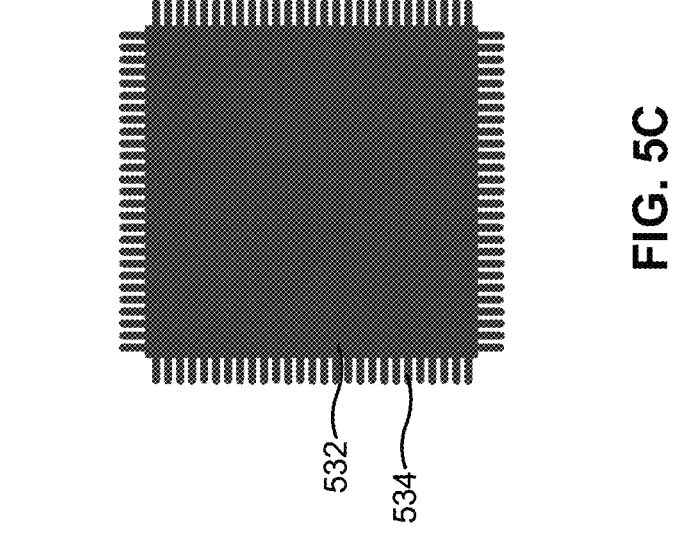

FIGS. 5A-5C are diagrams of example cooling component configurations described of the cooling structure 218 described herein. In particular, FIGS. 5A-5C are diagrams of example configurations of one or more cooling components (e.g., a heat removal structure 220, a heat dissipation structure 222, an inter-die cooling structure 224) of the cooling structure 218.

As shown in a cross-sectional view in FIG. 5A, a cooling component configuration 510 includes a cooling component 512 (e.g., a heat removal structure 220, a heat dissipation structure 222, an inter-die cooling structure 224) that includes a round cross-sectional structure (or an approximately round structure). The cooling component 512 is surrounded by one or more concentric layers, including a buffer ring 514 (e.g., a die intermetal dielectric (IMD) layer) and a guard ring 516. The buffer ring 514 and the guard ring 516 are configured to protect or electrically isolate the dies 202 and 204 and/or other portions of the stacked semiconductor device 200 from the cooling component 512.

As shown in a cross-sectional view in FIG. 5B, a cooling component configuration 520 includes a cooling component 522 (e.g., a heat removal structure 220, a heat dissipation structure 222, an inter-die cooling structure 224) that includes a polygonal cross-sectional structure. In the example illustrated in FIG. 5B, the cooling component configuration 520 includes a cross shape. However, other polygonal shapes (e.g., a triangle shape, a square shape, and/or another polygonal shape) are within the scope of the present disclosure. The cooling component 522 is surrounded by one or more concentric layers, including a buffer ring 524 and a guard ring 526.

As shown in a cross-sectional view in FIG. 5C, a cooling component configuration 530 includes a cooling component 532 (e.g., a heat removal structure 220, a heat dissipation structure 222, an inter-die cooling structure 224) that includes a plurality of fins 534. The fins 534 increase the surface area of the cooling component 532, which increases the thermal capacity of the cooling component 532 and the cooling performance of the cooling structure 218. The fins 534 may be arranged in various configurations, including around a perimeter of the cooling component 532, in a matrix configuration, and/or in another configuration. Moreover, the fins 534 may be formed into various shapes, including straight fins, curved or swept fins, and/or other fin shapes.

As indicated above, FIGS. 5A-5C are provided as examples. Other examples may differ from what is described with regard to FIGS. 5A-5C.

FIGS. 6A-6D are diagrams of example portions described herein of the stacked semiconductor device 200 of FIG. 2. The example portions described in connection with FIGS. 6A-6D include a thermoelectric cooling structure that is configured to cool one or more of the dies 202 or 204 based on a thermoelectric effect such as the Peltier effect. The thermoelectric cooling structure may be included in the stacked semiconductor device 200, as an alternative to the cooling structure 218 described herein or in addition to the cooling structure 218 described herein, to provide increased cooling performance for the stacked semiconductor device 200. In these implementations, the thermoelectric cooling circuit may be connected to the cooling structure 218, which functions as a heatsink to dissipate heat removed from the dies 202 and/or 204 by the thermoelectric cooling structure.

Figure 6A:
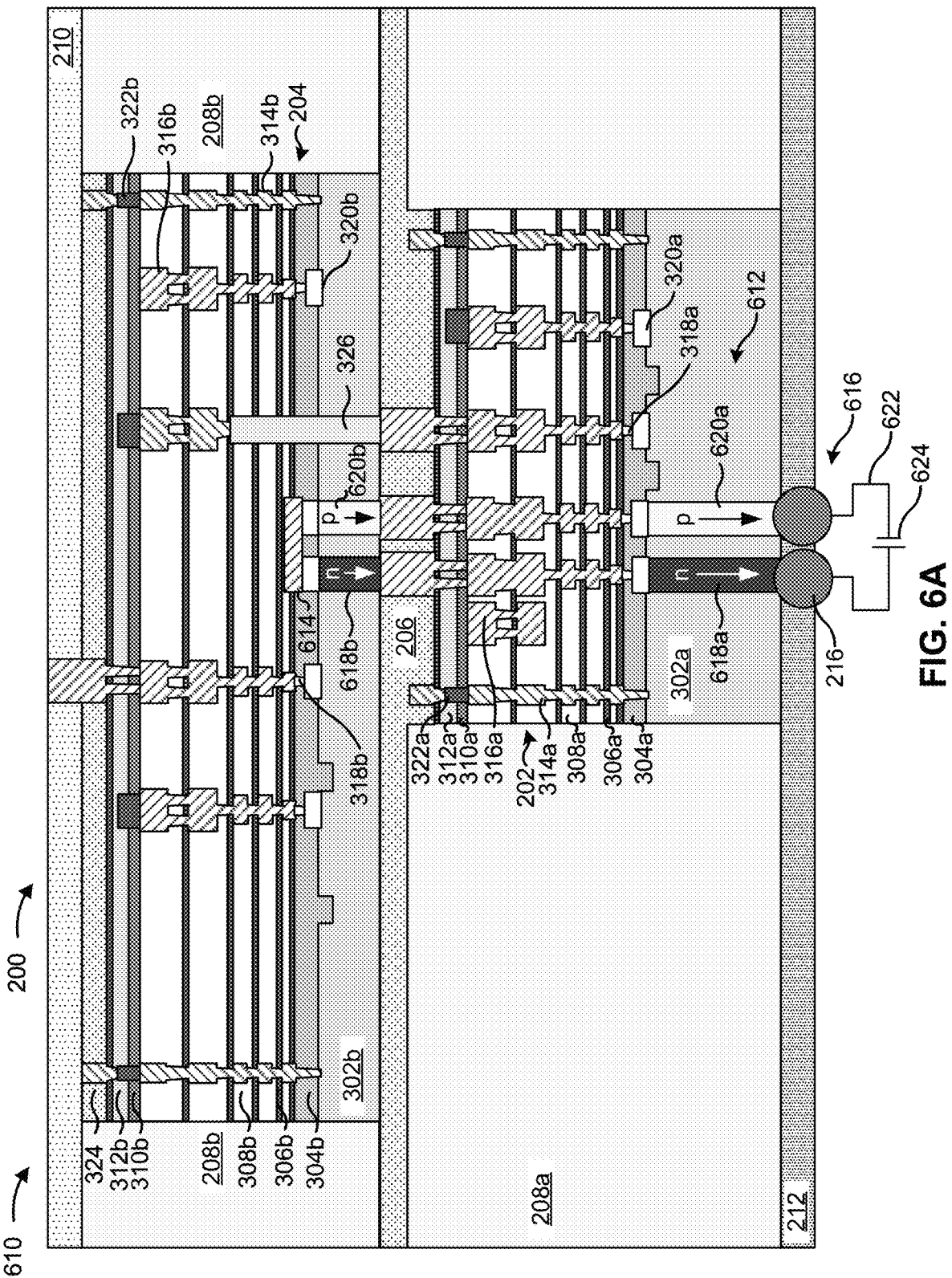
FIGS. 6A-6D are diagrams of example portions described herein of the stacked semiconductor device of FIG. 2.

FIG. 6A illustrates an example portion 610 of the stacked semiconductor device 200. The example portion 610 includes similar structures and layers as the portion 300 described in connection with FIG. 3, and may be formed by similar operations and techniques described in connection with one or more of FIGS. 4A-4T. The example portion 610 includes a thermoelectric cooling structure 612 that is configured to cool and/or remove heat from the die 204.

As shown in FIG. 6A, the thermoelectric cooling structure 612 includes a cold side 614 in the die 204 and a hot side 616 in and/or on the die 202. In some implementations, the hot side 616 includes a heatsink external to the die 202. In some implementations, the hot side 616 includes the cooling structure 218. The cold side 614 and the hot side 616 include one or more thermally conductive materials such that heat generated by the die 204 is enabled to be transferred and removed by the cold side 614 and transferred from the cold side 614 to the hot side 616.

The cold side 614 and the hot side 616 are thermally connected in parallel by a plurality of n-type semiconductor structures 618a and 618b and a plurality of p-type semiconductor structures 620a and 620b. Moreover, the cold side 614 and the hot side 616 may be thermally connected by a plurality of circuits 316a and 316b, a plurality of transistors 320a and 320b, and/or other structures included in the dies 202 and/or 204. The n-type semiconductor structures 618a and 618b include one or more n-type semiconductor materials and/or one or more n-doped semiconductor materials. The p-type semiconductor structures 620a and 620b include one or more p-type semiconductor materials and/or one or more p-doped semiconductor materials. The n-type semiconductor structure 618a and the p-type semiconductor structure 620a extend through the substrate 302a of the die 202. The n-type semiconductor structure 618b and the p-type semiconductor structure 620b extend through the substrate 302b of the die 204.

As further shown in FIG. 6A, the n-type semiconductor structure 618a and the p-type semiconductor structure 620a are electrically connected by a plurality of solder balls 216 to a control circuit 622, which electrically connects the n-type semiconductor structure 618a and the p-type semiconductor structure 620a to an electrical source 624 (e.g., a voltage source, a current source). The n-type semiconductor structures 618a and 618b, and the p-type semiconductor structures 620a and 620b, are electrically connected to the electrical source 624 in series by the control circuit 622. In particular, the n-type semiconductor structures 618a and 618b electrically connect to a terminal of the electrical source 624 and to the cold side 614. The p-type semiconductor structures 620a and 620b electrically connect to the cold side 614 and another terminal of the electrical source 624.

The thermoelectric cooling structure 612 cools the die 204 by removing heat from the die 204 through the cold side 614. The heat is received at the hot side 616 and is dissipated. The heat is transferred from the cold side 614 when a voltage or a current is applied to the control circuit 622 by the electrical source 624.

Figure 6B:
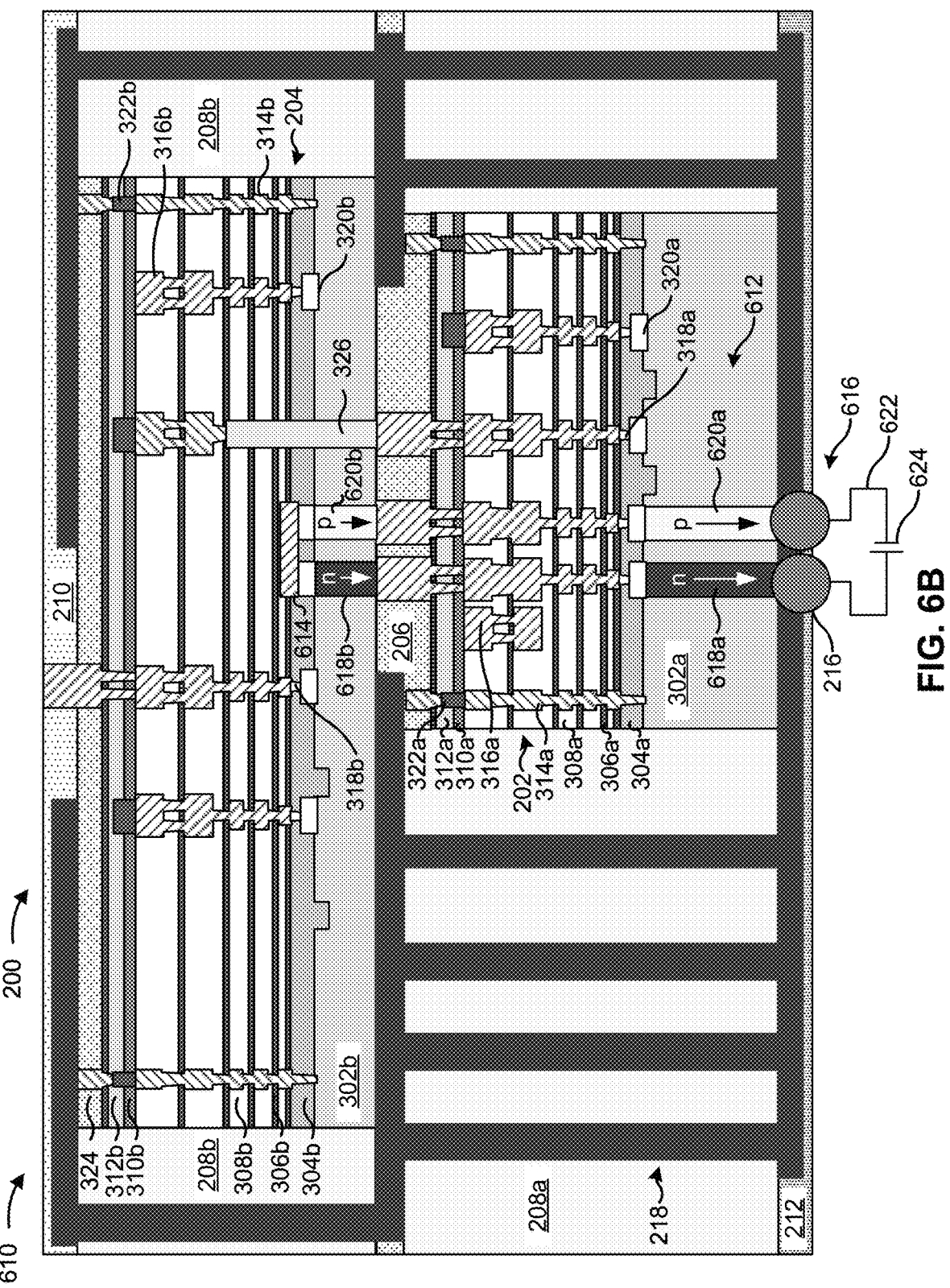

FIG. 6B illustrates an example in which the hot side 616 of the thermoelectric cooling structure 612 includes the cooling structure 218.

Figure 6C:
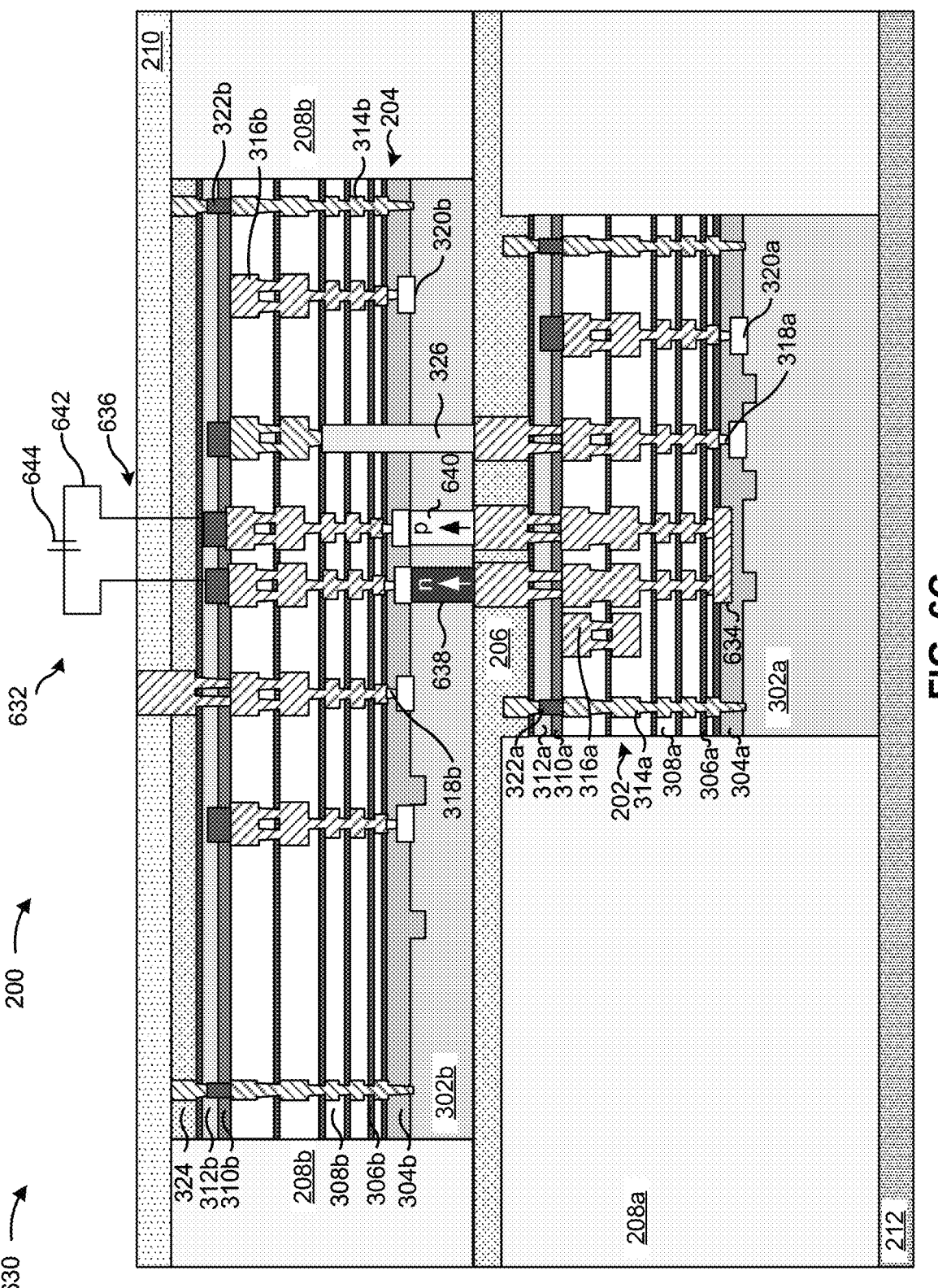

FIG. 6C illustrates an example portion 630 of the stacked semiconductor device 200. The example portion 630 includes similar structures and layers as the portion 300 described in connection with FIG. 3, and may be formed by similar operations and techniques described in connection with one or more of FIGS. 4A-4T. The example portion 630 includes a thermoelectric cooling structure 612 that is configured to cool and/or remove heat from the die 202.

As shown in FIG. 6C, the thermoelectric cooling structure 632 includes a cold side 634 in the die 202 and a hot side 636 in and/or on the die 204. In some implementations, the hot side 636 includes a heatsink external to the die 204. In some implementations, the hot side 636 includes the cooling structure 218. The cold side 634 and the hot side 636 are thermally connected in parallel by an n-type semiconductor structure 638 and a p-type semiconductor structures 640 that extend through the substrate 302b of the die 204. Moreover, the cold side 634 and the hot side 636 may be thermally connected by a plurality of circuits 316a and 316b, a plurality of transistors 320a and 320b, and/or other structures included in the dies 202 and/or 204.

As further shown in FIG. 6C, the n-type semiconductor structure 638 and the p-type semiconductor structure 640 are electrically connected by a plurality of metal pads 322b to a control circuit 642, which electrically connects the n-type semiconductor structure 638 and the p-type semiconductor structure 640 to an electrical source 644 (e.g., a voltage source, a current source). The n-type semiconductor structure 638 and the p-type semiconductor structure 640 are electrically connected to the electrical source 644 in series by the control circuit 642. The thermoelectric cooling structure 632 cools the die 202 by removing heat from the die 202 through the cold side 634. The heat is received at the hot side 636 and is dissipated.

Figure 6D:
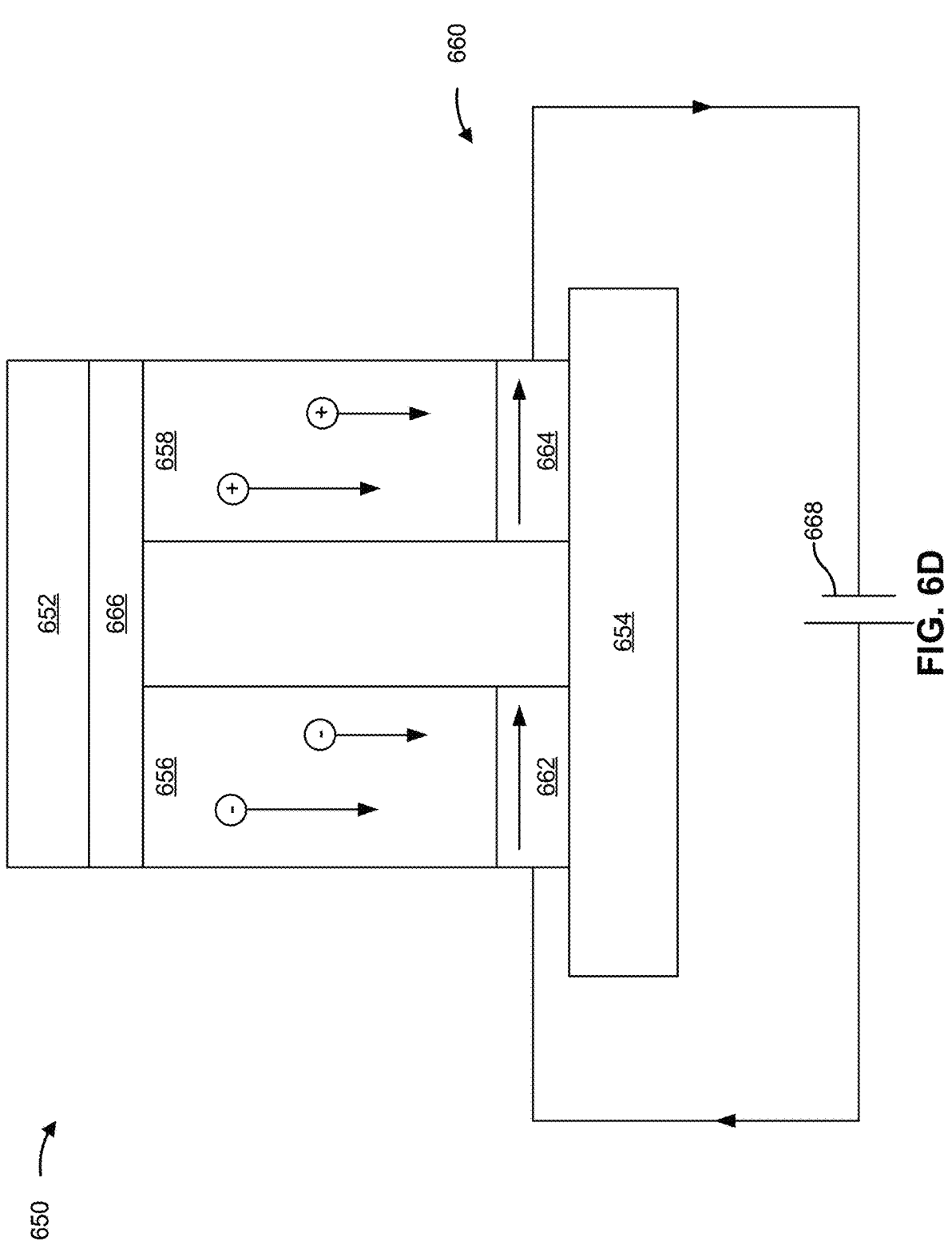

FIG. 6D illustrates a schematic view of a thermoelectric cooling structure 650, which may include the thermoelectric cooling structure 612 and/or the thermoelectric cooling structure 632. As shown in FIG. 6D, the thermoelectric cooling structure 650 includes a cold side 652, a hot side 654, an n-type semiconductor structure 656, a p-type semiconductor structure 658, a control circuit 660, an n-type contact 662, a p-type contact 664, a junction 666, and an electrical source 668.

The n-type semiconductor structure 656 and the p-type semiconductor structure 658 are thermally connected in parallel. In particular, first ends of the n-type semiconductor structure 656 and the p-type semiconductor structure 658 are connected to the cold side 652 (e.g., through the junction 666), and second ends of the n-type semiconductor structure 656 and the p-type semiconductor structure 658 are connected to the hot side 654 (e.g., through the contacts 662 and 664, respectively). The n-type semiconductor structure 656 and the p-type semiconductor structure 658 are electrically connected in series in that an electrically conductive path is formed from a first terminal of the electrical source 668 through the n-type semiconductor structure 656 (e.g., through the n-type contact 662), through the p-type semiconductor structure 658 (e.g., through the junction 666), and to a second terminal of the electrical source 668 (e.g., through the p-type contact 664).

In operation, an input is provided to the control circuit 660 by the electrical source 668. The input causes a current to flow through the control circuit 660 from the electrical source 668 to the n-type contact 662, from the n-type contact 662 to the junction 666 through the n-type semiconductor structure 656, from the junction 666 to the p-type contact 664 through the p-type semiconductor structure 658, and from the p-type contact 664 to electrical source 668. The n-type semiconductor structure 656 includes an excess of electrons and the p-type semiconductor structure 658 includes an excess of holes (and thus, a deficit of electrons). The flow of the current through the n-type semiconductor structure 656 and the p-type semiconductor structure 658 causes the excess charge carriers (e.g., the electrons of the n-type semiconductor structure 656 and the holes of the p-type semiconductor structure 658) to migrate from the junction to the respective contacts (e.g., the n-type contact 662 for the n-type semiconductor structure 656 and the p-type contact 664 for the p-type semiconductor structure 658). The migrating excess carriers transfer heat from the cold side 652 to the hot side 654, thereby providing cooling at the cold side 652.

As indicated above, FIGS. 6A-6D are provided as examples. Other examples may differ from what is described with regard to FIGS. 6A-6D.

Figure 7:
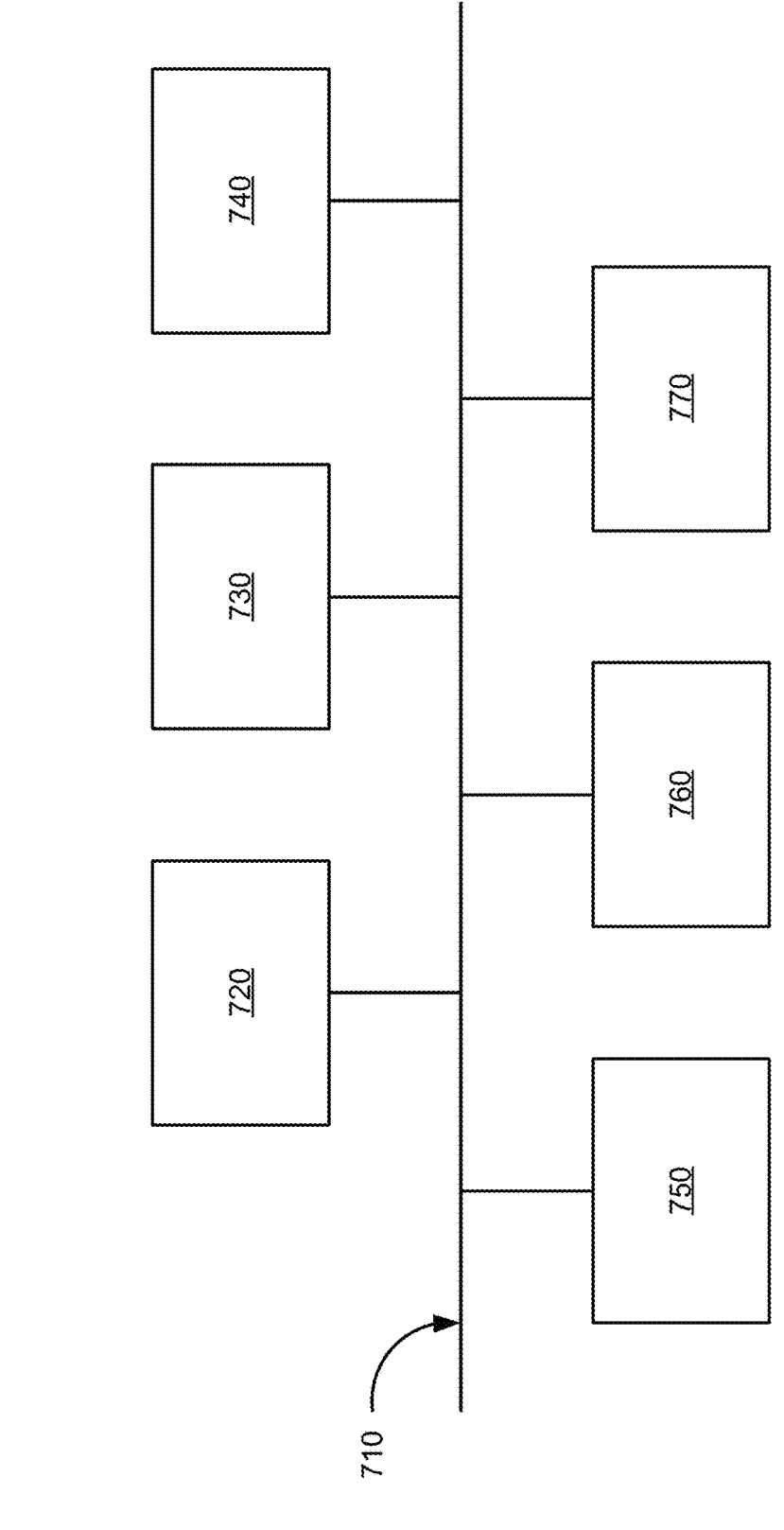
FIG. 7 is a diagram of example components of one or more devices of FIG. 1 described herein.

FIG. 7 is a diagram of example components of a device 700. In some implementations, one or more of the semiconductor processing tools 102-112 and/or the wafer/die transport tool 114 may include one or more devices 700 and/or one or more components of device 700. As shown in FIG. 7, device 700 may include a bus 710, a processor 720, a memory 730, a storage component 740, an input component 750, an output component 760, and a communication component 770.

Bus 710 includes a component that enables wired and/or wireless communication among the components of device 700. Processor 720 includes a central processing unit, a graphics processing unit, a microprocessor, a controller, a microcontroller, a digital signal processor, a field-programmable gate array, an application-specific integrated circuit, and/or another type of processing component. Processor 720 is implemented in hardware, firmware, or a combination of hardware and software. In some implementations, processor 720 includes one or more processors capable of being programmed to perform a function. Memory 730 includes a random access memory, a read only memory, and/or another type of memory (e.g., a flash memory, a magnetic memory, and/or an optical memory).

Storage component 740 stores information and/or software related to the operation of device 700. For example, storage component 740 may include a hard disk drive, a magnetic disk drive, an optical disk drive, a solid state disk drive, a compact disc, a digital versatile disc, and/or another type of non-transitory computer-readable medium. Input component 750 enables device 700 to receive input, such as user input and/or sensed inputs. For example, input component 750 may include a touch screen, a keyboard, a keypad, a mouse, a button, a microphone, a switch, a sensor, a global positioning system component, an accelerometer, a gyroscope, and/or an actuator. Output component 760 enables device 700 to provide output, such as via a display, a speaker, and/or one or more light-emitting diodes. Communication component 770 enables device 700 to communicate with other devices, such as via a wired connection and/or a wireless connection. For example, communication component 770 may include a receiver, a transmitter, a transceiver, a modem, a network interface card, and/or an antenna.

Device 700 may perform one or more processes described herein. For example, a non-transitory computer-readable medium (e.g., memory 730 and/or storage component 740) may store a set of instructions (e.g., one or more instructions, code, software code, and/or program code) for execution by processor 720. Processor 720 may execute the set of instructions to perform one or more processes described herein. In some implementations, execution of the set of instructions, by one or more processors 720, causes the one or more processors 720 and/or the device 700 to perform one or more processes described herein. In some implementations, hardwired circuitry may be used instead of or in combination with the instructions to perform one or more processes described herein. Thus, implementations described herein are not limited to any specific combination of hardware circuitry and software.

The number and arrangement of components shown in FIG. 7 are provided as an example. Device 700 may include additional components, fewer components, different components, or differently arranged components than those shown in FIG. 7. Additionally, or alternatively, a set of components (e.g., one or more components) of device 700 may perform one or more functions described as being performed by another set of components of device 700.

Figure 8:
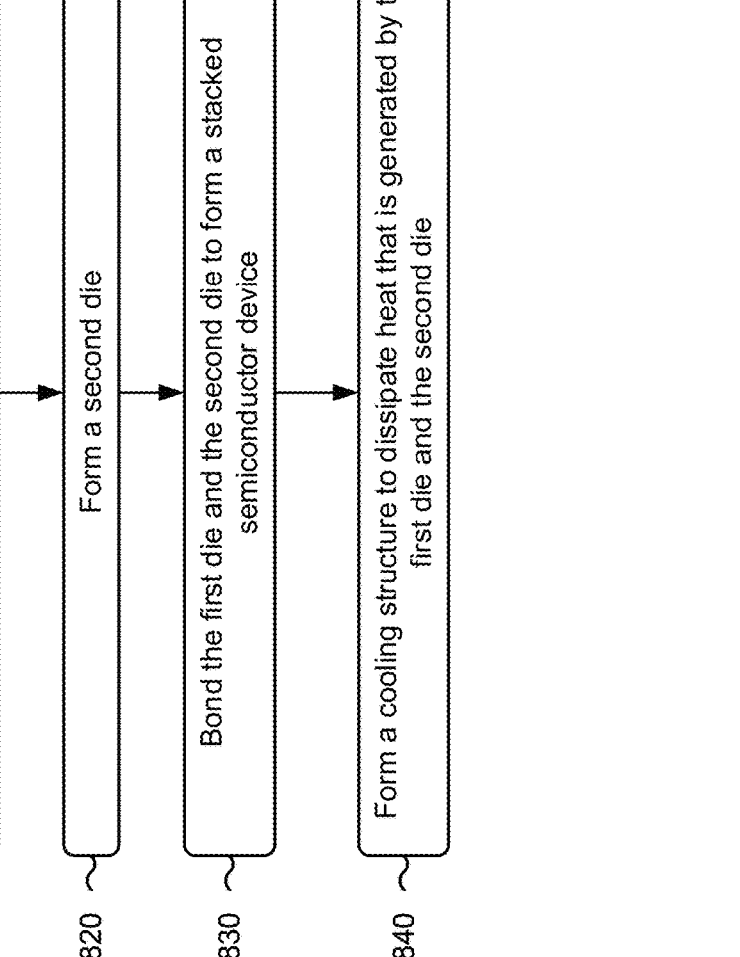
FIG. 8 is a flowchart of an example process relating to forming a stacked semiconductor device described herein.

FIG. 8 is a flowchart of an example process 800 associated with forming a stacked semiconductor device including a cooling structure. In some implementations, one or more process blocks of FIG. 8 may be performed by one or more of semiconductor processing tools (e.g., one or more of the semiconductor processing tools 102-112). Additionally, or alternatively, one or more process blocks of FIG. 8 may be performed by one or more components of device 700, such as processor 720, memory 730, storage component 740, input component 750, output component 760, and/or communication component 770.

As shown in FIG. 8, process 800 may include forming a first die (block 810). For example, one or more of the semiconductor processing tools 102-112 may form a first die (e.g., the die 202), as described above.

As further shown in FIG. 8, process 800 may include forming a second die (block 820). For example, one or more of the semiconductor processing tools 102-112 may form a second die (e.g., the die 204), as described above.

As further shown in FIG. 8, process 800 may include bonding the first die and the second die to form a stacked semiconductor device (block 830). For example, one or more of the semiconductor processing tools 102-112 may bond the first die and the second die to form the stacked semiconductor device 200, as described above.

As further shown in FIG. 8, process 800 may include forming a cooling structure to dissipate heat that is generated by the first die and the second die (block 840). For example, one or more of the semiconductor processing tools 102-112 may form the cooling structure 218 to dissipate heat that is generated by the first die and the second die, as described above.

Process 800 may include additional implementations, such as any single implementation or any combination of implementations described below and/or in connection with one or more other processes described elsewhere herein.

In a first implementation, forming the cooling structure 218 includes forming one or more components (e.g., one or more heat removal structures 220, one or more heat dissipation structures 222, and/or one or more inter-die cooling structures 224) of the cooling structure 218 after bonding the first die and the second die. In a second implementation, alone or in combination with the first implementation, forming the cooling structure 218 includes forming one or more other components (e.g., one or more heat removal structures 220, one or more heat dissipation structures 222, and/or one or more inter-die cooling structures 224) of the cooling structure 218 prior to bonding the first die and the second die.

In a third implementation, alone or in combination with one or more of the first and second implementations, forming the cooling structure 218 includes forming a plurality of heat removal structures 220 over a carrier substrate (e.g., the carrier substrate 402), and bonding the second die to the carrier substrate after forming the plurality of heat removal structures 220. In a fourth implementation, alone or in combination with one or more of the first through third implementations, forming the cooling structure 218 includes forming a dielectric layer (e.g., the dielectric layer 208*b*) around the second die, and forming a plurality of heat dissipation structures 222 in the dielectric layer around the second die.

In a fifth implementation, alone or in combination with one or more of the first through fourth implementations, forming the cooling structure 218 includes forming a bonding layer (e.g., the bonding layer 206) over the second die, forming a plurality of heat removal structures 220 in the bonding layer, and bonding, using the bonding layer, the second die and the first die after forming the plurality of heat removal structures 220. In a sixth implementation, alone or in combination with one or more of the first through fifth implementations, forming the cooling structure 218 includes etching through the first die and through the second die after bonding the first die and the second die, and forming an inter-die cooling structure 224 through the first die and through the second die after etching through the first die and through the second die.

In a seventh implementation, alone or in combination with one or more of the first through sixth implementations, forming the cooling structure 218 includes forming a first portion of a dielectric layer (e.g., the dielectric layer 208*a*) around the first die, forming a first plurality of heat dissipation structures 222 in the dielectric layer around the first die, forming a first heat removal structure 220 connected to the first plurality of heat dissipation structures 222, forming a second portion of the dielectric layer over the first portion of the dielectric layer and over the first die, forming a second plurality of heat dissipation structures 222 connected to the first heat removal structure 220, and forming a second heat removal structure 220 connected to the second plurality of heat dissipation structures 222.

Although FIG. 8 shows example blocks of process 800, in some implementations, process 800 may include additional blocks, fewer blocks, different blocks, or differently arranged blocks than those depicted in FIG. 8. Additionally, or alternatively, two or more of the blocks of process 800 may be performed in parallel.

In this way, a stacked semiconductor device includes a cooling structure to increase the cooling efficiency of the stacked semiconductor device. The cooling structure includes various types of cooling components integrated into the stacked semiconductor device that are configured to remove and/or dissipate heat from the dies of the stacked semiconductor device. In this way, the cooling structure reduces device failures and permits the stacked semiconductor device to operate at greater voltages, greater speeds, and/or other increased performance parameters by removing and/or dissipating heat from the stacked semiconductor device.

As described in greater detail above, some implementations described herein provide a stacked semiconductor device. The stacked semiconductor device includes a first die. The stacked semiconductor device includes a second die bonded with the first die. The stacked semiconductor device includes a cooling structure including, a plurality of heat removal structures configured to remove heat from at least one of the first die or the second die a plurality of heat dissipation structures configured to dissipate the heat.

As described in greater detail above, some implementations described herein provide a method. The method includes forming a first die. The method includes forming a second die. The method includes bonding the first die and the second die to form a stacked semiconductor device. The method includes forming a cooling structure to dissipate heat that is generated by the first die and the second die.

As described in greater detail above, some implementations described herein provide a stacked semiconductor device. The stacked semiconductor device includes a first die. The stacked semiconductor device includes a second die bonded with the first die. The stacked semiconductor device includes a thermoelectric cooling structure, that extends into at least a portion of the first die and into at least a portion of the second die, comprising, a cold side, included in the first die, configured to cool the first die, and a hot side, included in the second die, configured to receive heat from the cold side.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A stacked semiconductor device, comprising:
a first die;
a second die bonded with the first die at a bonding layer;
a first dielectric layer around side surfaces of the first die;
a second dielectric layer around side surfaces of the second die; and
a cooling structure including:
   a plurality of heat removal structures configured to remove heat from at least one of the first die or the second die; and
   a plurality of vertical heat dissipation structures configured to dissipate the heat,
      wherein a first vertical heat dissipation structure of the plurality of vertical heat dissipation structures is formed in the first dielectric layer,
      wherein second multiple vertical heat dissipation structures, of the plurality of vertical heat dissipation structures, are formed in the second dielectric layer,
      wherein at least one horizontal heat removal structure, of the plurality of heat removal structures, is formed in the bonding layer and above a portion of the first die, and
      wherein the at least one horizontal heat removal structure is physically connected to the first vertical heat dissipation structure and the second multiple vertical heat dissipation structures.

2. The stacked semiconductor device of claim 1, wherein at least one of a heat removal structure of the plurality of heat removal structures or a vertical heat dissipation structure of the plurality of vertical heat dissipation structures is surrounded by:
a guard ring, and
an intermetal dielectric buffer ring.

3. The stacked semiconductor device of claim 1, wherein at least one of a heat removal structure of the plurality of heat removal structures or a vertical heat dissipation structure of the plurality of vertical heat dissipation structures includes:
a round structure, or
a polygon structure.

4. The stacked semiconductor device of claim 1, wherein the plurality of heat removal structures extend in a first plane of the stacked semiconductor device; and
wherein the plurality of vertical heat dissipation structures extend in a second plane, of the stacked semiconductor device, that is approximately perpendicular to the first plane.

5. The stacked semiconductor device of claim 1, wherein one or more of the plurality of vertical heat dissipation structures include a hollow structure that is configured to dissipate the heat through convection.

6. The stacked semiconductor device of claim 1, further comprising:

an inter-die cooling structure that extends through the first die and the second die,
   wherein the inter-die cooling structure is connected to one or more of the plurality of heat removal structures.

7. The stacked semiconductor device of claim 1, wherein the first die and the second die are connected by a through substrate via (TSV).

8. The stacked semiconductor device of claim 1, wherein at least one of a heat removal structure of the plurality of heat removal structures or a vertical heat dissipation structure of the plurality of vertical heat dissipation structures includes a plurality of fins.

9. A stacked semiconductor device, comprising:
a first die;
a second die bonded with the first die at a bonding layer;
a first dielectric layer around side surfaces of the first die;
a second dielectric layer around side surfaces of the second die; and
a thermoelectric cooling structure, that extends into at least a portion of the first die and into at least a portion of the second die, comprising:
   a cold side, included in the first die, configured to cool the first die,
   a hot side, included in the second die, configured to receive heat from the cold side,
   an n-type semiconductor structure that thermally connects the cold side included in the first die and the hot side included in the second die,
   a p-type semiconductor structure that thermally connects the cold side, included in the first die, and the hot side included in the second die,
   a first vertical heat dissipation structure formed in the first dielectric layer,
   a second plurality of vertical heat dissipation structures formed in the second dielectric layer, and
   a horizontal heat removal structure formed in the bonding layer and below a portion of the first die,
      wherein the horizontal heat removal structure is physically connected to the first vertical heat dissipation structure and the second plurality of vertical heat dissipation structures.

10. The stacked semiconductor device of claim 9, wherein the n-type semiconductor structure extends through a substrate of the second die; and
wherein the p-type semiconductor structure extends through the substrate of the second die.

11. The stacked semiconductor device of claim 9, wherein the n-type semiconductor structure and the p-type semiconductor structure are thermally connected to the cold side included in the first die and the hot side included in the second die in parallel; and
wherein the n-type semiconductor structure and the p-type semiconductor structure are configured to be electrically connected to an electrical source in series.

12. The stacked semiconductor device of claim 9, wherein the n-type semiconductor structure is a first n-type semiconductor structure that extends through a substrate of the first die;
wherein the p-type semiconductor structure is a first p-type semiconductor structure that extends through the substrate of the first die; and
wherein the stacked semiconductor device further comprises:
   a second n-type semiconductor structure that extends through a substrate of the second die; and a second p-type semiconductor structure that extends through the substrate of the second die, wherein the second n-type semiconductor structure and the second p-type semiconductor structure thermally connect the cold side included in the first die and the hot side included in the second die.

13. The stacked semiconductor device of claim 9, wherein the hot side included in the second die comprises:

a plurality of heat removal structures configured to remove heat from at least one of the first die or the second die; and a plurality of heat dissipation structures configured to dissipate heat.

14. The stacked semiconductor device of claim 13, wherein the plurality of heat dissipation structures comprise one or more vertical heat dissipation structures.

15. A stacked semiconductor device, comprising:

a first die;

a second die bonded with the first die at a bonding layer;

a first dielectric layer around side surfaces of the first die;

a second dielectric layer around side surfaces of the second die; and a cooling structure including:

an inter-die cooling structure formed in and through the first die and the second die, wherein the inter-die cooling structure is configured to remove heat from the first die and the second die;

a plurality of heat removal structures configured to remove heat from at least one of the first die or the second die; and a plurality of heat dissipation structures configured to remove heat from at least one of the first die or the second die, wherein a first heat dissipation structure of the plurality of heat dissipation structures is formed in the first dielectric layer, wherein second multiple heat dissipation structures, of the plurality of heat dissipation structures, are formed in the second dielectric layer, wherein at least one horizontal heat removal structure, of the plurality of heat removal structures, is formed in the bonding layer and above a portion of the first die, and wherein the at least one horizontal heat removal structure is physically connected to the first heat dissipation structure and the second multiple heat dissipation structures.

16. The stacked semiconductor device of claim 15, wherein the inter-die cooling structure is connected to one or more heat removal structures of the plurality of heat removal structures.

17. The stacked semiconductor device of claim 15, further comprising another inter-die cooling structure.

18. The stacked semiconductor device of claim 15, wherein the plurality of heat removal structures are arranged horizontally in the stacked semiconductor device.

19. The stacked semiconductor device of claim 15, wherein the plurality of heat dissipation structures are arranged perpendicular to the plurality of heat removal structures.

20. The stacked semiconductor device of claim 15, wherein third multiple heat dissipation structures, of the plurality of heat dissipation structures, are formed above the second die.

* * * * *